United States Patent [19]
Karasawa et al.

[11] Patent Number: 6,034,432
[45] Date of Patent: *Mar. 7, 2000

[54] THIN FILM TRANSISTORS AND CONNECTING STRUCTURE FOR SEMICONDUCTORS AND A METHOD OF MANUFACTURING THE SAME

[75] Inventors: Junichi Karasawa; Kunio Watanabe, both of Nagano-ken, Japan

[73] Assignee: Seiko Epson Corporation, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/750,760

[22] PCT Filed: Apr. 17, 1996

[86] PCT No.: PCT/JP96/01047

§ 371 Date: Mar. 10, 1997

§ 102(e) Date: Mar. 10, 1997

[87] PCT Pub. No.: WO96/33512

PCT Pub. Date: Oct. 24, 1996

[30] Foreign Application Priority Data

Apr. 17, 1995 [JP] Japan .................................. 7-091147

[51] Int. Cl.[7] ........................... H01L 23/48; H01L 23/52; H01L 29/40
[52] U.S. Cl. ........................ 257/758; 257/751; 257/754; 257/756; 257/903; 438/638
[58] Field of Search ................................ 257/751, 754, 257/756, 758, 903; 438/638

[56] References Cited

U.S. PATENT DOCUMENTS 4,961,104  10/1990  Hirakawa .............................. 257/756
5,327,003  7/1994  Itabashi et al. ......................... 257/385
5,521,416  5/1996  Matsuoka et al. ...................... 257/377
5,521,859  5/1996  Ema et al. .............................. 365/149
5,536,960  7/1996  Hayashi ................................. 257/369
5,661,325  8/1997  Hayashi et al. ........................ 257/393
5,668,380  9/1997  Wuu et al. .............................. 257/66

FOREIGN PATENT DOCUMENTS 5-36920  2/1993  Japan .
5-259408  10/1993  Japan .
6-5820  1/1994  Japan .
6-151847  5/1994  Japan .

OTHER PUBLICATIONS

International Search Report for Intnatl. App. No. PCT/JP96/01047—1 page.

*Primary Examiner*—Olik Chaudhuri
*Assistant Examiner*—Howard Weiss
*Attorney, Agent, or Firm*—Harness, Dickey & Pierce, P.L.C.

[57] ABSTRACT

A metallic layer (10), a thin-film first polycrystalline silicon layer (14), a first contact hole for connecting the metallic layer and first polycrystalline silicon layer, a second polycrystalline silicon layer (18) which becomes an etching stopper layer for the prevention of penetration in the first contact hole area, and a second contact hole which connects the second polycrystalline silicon layer and the first polycrystalline silicon layer are included. P-type impurities are introduced into the first polycrystalline silicon layer, and the second polycrystalline silicon layer is non-doped in the first contact hole area. By a heating step, the P-type impurities in the first polycrystalline silicon layer are diffused to the second polycrystalline silicon layer. The second polycrystalline silicon layer is N-type in a memory cell area. An insulating layer may be formed into a concave shape in the first contact hole area to lower the height of the first polycrystalline silicon layer in the first contact hole area.

14 Claims, 20 Drawing Sheets

THIN FILM TRANSISTORS AND CONNECTING STRUCTURE FOR SEMICONDUCTORS AND A METHOD OF MANUFACTURING THE SAME

This Application claims benefit of 35 U.S.C. 371 priority of PCT/JP96/01047 filed Apr. 17, 1996.

BACKGROUND OF THE INVENTION

1. Technical Field

The present invention relates to a semiconductor memory device including a plurality of memory cells, particularly, static-type memory cells in which thin film transistors (hereinafter, referred to as TFTS) are used as load elements, and to a method of manufacturing the same, and relates to a structure taking connections between thin film wiring layers and other wiring layers, and to a technique for realizing the structure.

2. Discussion

An example of a circuit configuration of a semiconductor memory including a plurality of static-type memory cells in which the TFTs are used as the load elements is shown in FIG. 18. Driver transistors which constitute the memory cells comprise N-channel FETs (N1 to N2n), and the load elements comprises P-channel TFTs (P1 to P2n). Here, source, drain and channel regions (hereinafter, referred to as bulk) of the TFTs are formed by a first polycrystalline silicon layer (hereinafter, referred to as PLYD), and gate electrodes of the TFTs are formed by a second polycrystalline silicon layer (hereinafter, referred to as PLYC). The source regions of the TFTs are connected to a power line 504 comprised of a metallic layer (hereinafter, referred to as AL), such as aluminum, through a power supplying line 500 comprised of the PLYD and a contact hole 502.

The PLYD, which forms the power supplying line 500, has a thickness of about 300 to 500 angstroms, and is very thin. For this reason, when the power line 504 is connected to the power supplying line 500 through the contact hole 502, there causes a problem in that the power line 504 penetrates to a lower layer.

As an example for solving the problem of penetration, there is a first background art disclosed in, for example, Japanese Patent Application Laid-Open No. 5-190686. In this background art, as shown in FIG. 19A, in condition where the penetration does not occur, a PLYD (514), which is the power supplying line of the memory cells, is connected to an AL (516), which is the power line, through the contact hole CNT, whereby it becomes possible to supply power to the memory cells. On the other hand, in this background art, a PLYC (512) is formed on transistors comprising lower layers or an insulating layer 510. And, the PLYD (514), which is the power supplying line of the memory cells, is connected to this PLYC (512) through a contact hole THLC. Therefore, even if the penetration due to the contact hole CNT occurs as shown in FIG. 19B, the PLYD (514) will be connected to the AL (516) through the PLYC (512) and the CNT. That is to say, by providing the PLYC (512), it becomes possible to supply power to the memory cells. Unlike the PLYD (514), which forms the bulk of the TFTs, the thickness of the PLYC (512) can be thickened. Therefore, it can be sufficiently used as an etching stopper layer (penetration preventing layer) at the time of etching of the CNT.

In addition, as a second background art for solving the problem of penetration, there are background arts disclosed in Japanese Patent Application Laid-Open Nos. 5-259408 and 6-5820. In these background arts, as indicated by G in FIG. 20, the PLYD (514), which supplies a current to the TFTs of the memory cells, and the AL (516) which is the power line are connected on the side surface. In addition, in order to prevent occurrence of the penetration, the PLYC (512), which is the etching stopper layer, is provided directly below the CNT. And, the PLYC (512) and PLYD (514) are not connected directly because they prevent diffusion of impurities from the PLYC, and the PLYC is floating (potential is not supplied).

The first and second background arts as described above include the technical problems described below.

In the first background art shown in FIGS. 19A, 19B, since the PLYD (514) is the bulk of the P-channel TFT, it is necessary to introduce P-type impurities when bringing into conduction to be a P-type polycrystalline silicon layer. On the other hand, in order to utilize the PLYC (512), which is the etching stopper layer, for the gate electrodes of the TFTS, and so on in the memory cell region, it is necessary to introduce N-type impurities to be an N-type polycrystalline silicon layer. Impurity concentrations of the PLYC (512) and the PLYD (514) are, for example, about $3 \times 10^{20}/\text{cm}^3$, and $1 \times 10^{20}/\text{cm}^3$, respectively, and the impurity concentration of the PLYC (512) is higher. Therefore, the N-type impurities contained in the PLYC (512) are diffused to the PLYD (514), so that a situation occurs in which a PN parasitic diode is formed on such a position indicated by F of FIG. 19A. Since power of the high potential side is supplied to the AL (516), the parasitic diode serves as a reverse-direction diode when supplying the power to the memory cells. For this reason, power supplying ability of the ON-state TFTs is limited by this reverse-direction parasitic diode to greatly affect properties of data retention of the memory cells and so on. As one technique for preventing generation of such parasitic diode, a technique may be considered in which the PLYC (512), which is the N-type in the memory cell area is converted into the P-type in a certain area of the CNT. However, if this technique is adopted, the number of steps of photo lithography and ion implantation increases and the steps become complicated. This leads reduction in yield of products.

On the other hand, in the second background art, the PLYD (514) is connected to the AL (516), which is the power line, at the side surface, as indicated by G of FIG. 20. Therefore, contact resistance varies considerably, and adversely affects properties of the products. The measurements of Vd-Id characteristics of the contact connected with the construction of FIG. 20 are shown in FIG. 21. Here, Vd is the voltage applied to the contact, and Id is the current flowing through the contact. It can be understood that Id varies greatly from $10^{-10}$ A to $10^{-6}$ A when Vd=0.1 V.

The present invention is made to solve the technical problems as described above, and has its object to provide a semiconductor memory device and a method of manufacturing the same which can solve the problem of penetration when other wiring layers are connected to thin film layers, and obtain a stable and sufficiently low contact resistance.

SUMMARY OF THE INVENTION

In order to solve the above problems, the present invention provides a semiconductor memory device including a plurality of memory cells, comprising: a first wiring layer; a thin-film second wiring layer provided below the first wiring layer; a first contact hole for connecting the first and second wiring layers; a third wiring layer which is provided below the second wiring layer and which becomes an etching stopper layer for the prevention of penetration in the first contact hole forming area; and a second contact hole which is provided below the first contact hole, and which connects the second wiring layer and the third wiring layer, wherein first conductivity-type impurities are introduced into the second wiring layer, and wherein the etching stopper layer formed by said third wiring layer is non-doped at least in the first contact hole forming area.

According to the present invention, the etching stopper layer formed by the third wiring layer functions as a penetration preventing layer. And, this etching stopper layer is non-doped, so that the first conductivity-type impurities diffuse in the etching stopper layer from an area which contacts the second wiring layer. Therefore, the first wiring layer and the second wiring layer can be electrically connected through the area in which the first conductivity-type impurities are diffused, whereby contact resistance and variations thereof can be reduced. According to this embodiment, the etching stopper layer is non-doped, so that impurities do not diffuse in the second wiring layer form the etching stopper layer, and a generation of a parasitic diode can be prevented, whereby impedance of paths from the first wiring layer to the second wiring layer can be reduced.

And, the present invention is characterized in that the memory cells are memory cells of static type including a pair of thin film transistors which become load elements, and a pair of driver transistors, the first wiring layer is formed of metal and becomes a power line, the second wiring layer is formed of a first polycrystalline silicon and becomes source, drain and channel regions of the thin film transistors, and a power supplying line to the memory cells, and the third wiring layer is formed of a second polycrystalline silicon.

The bulk (source, drain and channel regions) of the thin film transistors is a thin film, and when the second wiring layer forming this thin film is connected to the first wiring layer, which is a power line, a problem of penetration tends to arise. According to the present invention, the problem of penetration can be solved by providing the etching stopper layer. According to the present invention, the generation of the parasitic diode on the power supplying line, which is formed by the second wiring layer, can be prevented, so that data retention properties of the memory cells and so on can be improved. The thin film transistors may be used as resistive elements.

And, the present invention is characterized in that, in the area of the memory cells, second conductivity-type impurities which differ from the first conductivity-type impurities in polarity are introduced into the third wiring layer, and the third wiring layer becomes gate electrodes of the thin film transistors, and that the gate electrodes are directly connected to a second conductivity-type drain region of the driver transistors.

According to the present invention, the second conductivity-type impurities are introduced into the gate electrodes comprised of the third wiring layer. Therefore, even if the gate electrodes comprised of the third wiring layer are directly connected to the drain region of the drive transistors, the parasitic diode and so on are not generated, so that memory cells of excellent properties can be obtained. And the third wiring layer is non-doped in the first contact hole forming area, so that the generation of the parasitic diode on the power supplying line can be prevented without adding new steps.

And, the present invention is characterized in that the first conductivity-type impurities introduced into the second wiring layer are diffused to the non-doped etching stopper layer by a given heating step.

According to the present invention, by using the given heating step, the first conductivity-type impurities from the second wiring layer can be diffused to a deeper position. Therefore, even if the penetration occurs in the second wiring layer and the etching stopper layer comprised of the third wiring layer is undergone over-etching, etc., the area in which the first conductivity-type impurities are diffused can be left in the etching stopper layer, whereby contact resistance and variations thereof can be reduced.

And, the present invention is characterized in that the heating step doubles as a heating step for activating the first conductivity-type impurities.

According to the present invention, the first conductivity-type impurities in the second wiring layer and the etching stopper layer can be activated. This can increase carrier density of the second wiring layer and the etching stopper layer and reduce sheet resistance of the second wiring layer and the etching stopper layer.

And, the present invention is characterized in that, in the area of the memory cells, second conductivity-type impurities which differ from the first conductivity-type impurities in polarity are introduced into the third wiring layer.

According to the present invention, the second conductivity-type impurities are introduced into the third wiring layer in the memory cell area, the third wiring layer can be brought into conduction, thereby making it possible to utilize the third wiring layer for gate electrodes and conductive layers and so on of the memory cells. Incidentally, as one technique for preventing the occurrence of the above-described parasitic diode, a technique may be also considered in which the first conductivity-type impurities are introduced into the etching stopper layer. According to this technique, however, it is necessary to introduce different impurities into the memory cell area and into the first contact hole forming area, so that extra steps are required. According to the present invention, the extra steps do not have to be added for the prevention of occurrence of the parasitic diode, so that the number of steps can be reduced and the yield of products can be improved.

And, the present invention is characterized in that L3 is 1.5 $\mu$m or more where the distance between a boundary of an area of the third wiring layer into which the second conductivity-type impurities are introduced and an area into which the second conductivity-type impurities are not introduced so as to be non-doped, and an end of the boundary side of the second contact hole is L3.

This can prevent a situation such that the second conductivity-type impurities diffuse to the non-doped area to increase contact resistance. Incidentally, the non-doped area and the area into which the second conductivity-type impurities are introduced may be separated in terms of layout patterns.

And, the present invention is characterized in that L2 is larger than (L1+2×L4) where the diameters of the first and second contact holes are L1, L2, respectively and an alignment allowance of the first contact hole and the second contact hole is L4.

This can prevent generation of a side-surface contact. Incidentally, by forming L1 to the minimum value in view of design rule, the chip area can be optimized.

And, the present invention provides a semiconductor memory device including a plurality of memory cells, comprising: a first wiring layer; a thin-film second wiring layer provided below the first wiring layer; and a first contact hole for connecting the first and second wiring layers, wherein an insulating layer below the second wiring layer is formed into a concave shape at least in the first contact hole forming area, and wherein the height of the second wiring layer from a semiconductor substrate surface in the first contact hole forming area is lower than the height of the second wiring layer form the semiconductor substrate surface in the area other than the first contact hole forming area.

According to the present invention, the second wiring layer can be formed at a lower position in the first contact hole forming area. This can thicken the thickness of the insulating layer provided above the second wiring layer in the first contact hole forming area, whereby the problem of penetration can be easily solved.

And, the present invention is characterized in that the concave shape is formed using a forming step of a second contact hole for connecting the second wiring layer and the other layer below the second wiring layer.

This can form the concave shape without providing new steps for the formation of the concave shape, thereby improving the yield of the products.

And, the present invention is characterized in that D1 is smaller than D2×K where the etching depth of the concave shape is D1, an etching selection ratio of the other layer below the second wiring layer to the insulating layer below the second wiring layer is 1:K, and the thickness of the other layer is D2.

By utilizing the etching selectivity between the other layer and the insulating layer, it becomes possible to form the concave shape having a desired depth within a range satisfying a condition of D1<D2×K.

And, the present invention is characterized in that L1 is about (L2−2×L4) where the diameters of the first contact hole and the concave shape are L1, L2, respectively and alignment allowance of the first contact hole and the second contact hole is L4.

This can make L1 as small as possible to the extent that side-surface contact is not generated, whereby the thickness of the insulating layer above the second wiring layer in the concave shape forming area can be thickened and the occurrence of the penetration can be effectively prevented.

And, the present invention is characterized in that L2 is 2×γ1 or less where the diameter of the concave shape is L2 and the thickness of an insulating layer between the first wiring layer and the second wiring layer in the area other than said first contact hole forming area is γ1.

This can thicken the thickness of the insulating layer above the second wiring layer in the concave shape forming area, whereby the occurrence of the penetration can be prevented more effectively.

DETAILED DESCRIPTION OF THE PREFERRED EMBODIMENTS

A first embodiment of the present invention will be described with reference to FIG. 1.

(1) Basic Configuration

Below an AL (10, a first wiring layer), there is provided a PLYD (14, a thin-film second wiring layer), which becomes a power supplying line of the memory cell, and the AL (10) and the PLYD (14) are connected by means of a CNT (a first contact hole). Below the PLYD (14), there is provided a PLYC (18, a third wiring layer), which becomes an etching stopper layer for the prevention of penetration. In addition, below the CNT, there is provided a THLC (a second contact hole) for connecting the PLYD (14) and the PLYC (18).

P-type (first conductivity-type) impurities are introduced into the PLYD (14). The first characteristic of this embodiment is that impurities are not introduced into regions 18b, 18c of the PLYC (18), and these regions are non-doped.

By the regions 18b, 18c being non-doped in this way, the P-type impurities from the PLYD (14) are diffused in the region 18c, which contacts the P-type PLYD (14), so that an ohmic contact between the region 18c and the PLYD (14) becomes possible. As a result, even if the PLYD (14) has undergone over-etching causing penetration of the PLYD at the time of formation of the CNT, it becomes possible to supply power from the AL (10) to the PLYD (14) through the region 18c of the PLYC.

Figure 19A:
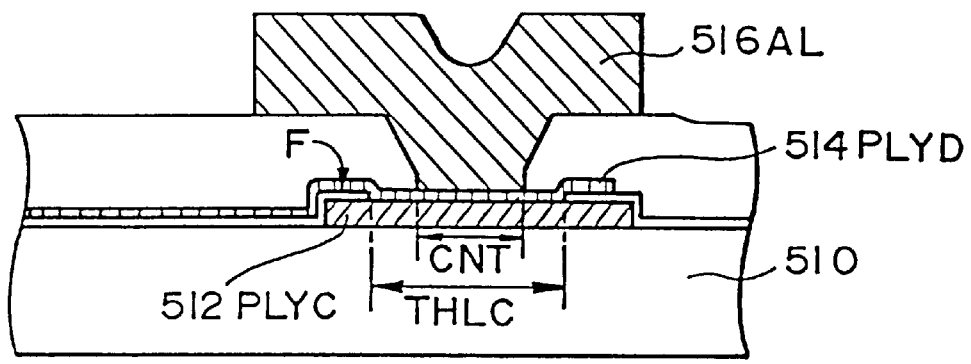
FIGS. 19A, 19B are view showing a sectional configuration of a first background example.
Figure 19B:
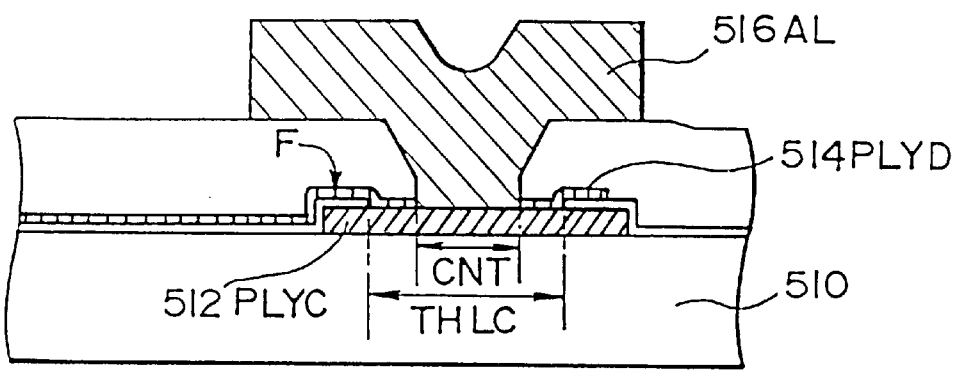
Figure 20:
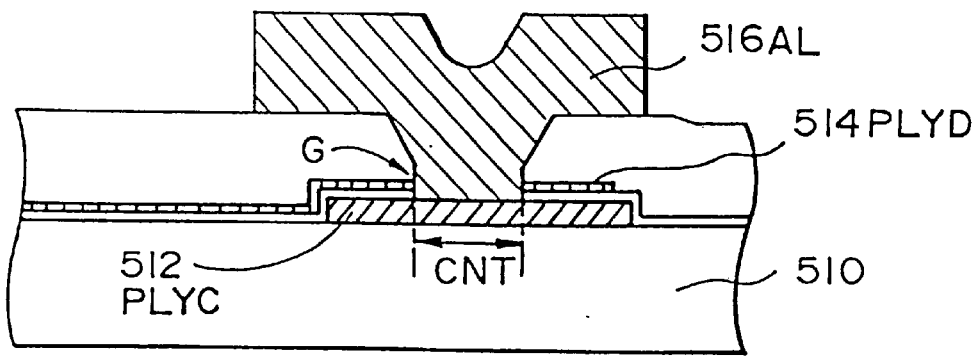
FIG. 20 is a view showing a sectional configuration of a second background example.

In addition, according to this embodiment, since the regions 18b, 18c are non-doped, a situation can be prevented in which the N-type impurities (second conductivity-type) are diffused from the regions 18b, 18c to the PLYD (14) to generate a parasitic diode (See F of FIG. 19A). As a result, properties of data retention, and so on of the memory cell can be improved.

As one technique for preventing the generation of the above parasitic diode, a technique may be also considered in which a new step is appended to introduce the P-type impurities into the regions 18b, 18c. According to this technique, however, 2-process photo lithography step and 2-process ion implantation step are required in order to form a PLYC having N-type and P-type regions, whereby the steps become complicated, and yield and cost of the products become worse. On the other hand, in order to make the region 18a N-type and make the regions 18b, 18c non-doped, only 1-process photo lithography step and 1-step ion implantation step are required. Therefore, according to this embodiment, the problem of penetration can be solved without adding new steps. That is to say, the number of steps can be reduced as compared with the above-described technique, whereby a manufacturing process can be simplified, and the yield of products can be improved.

Figure 2:
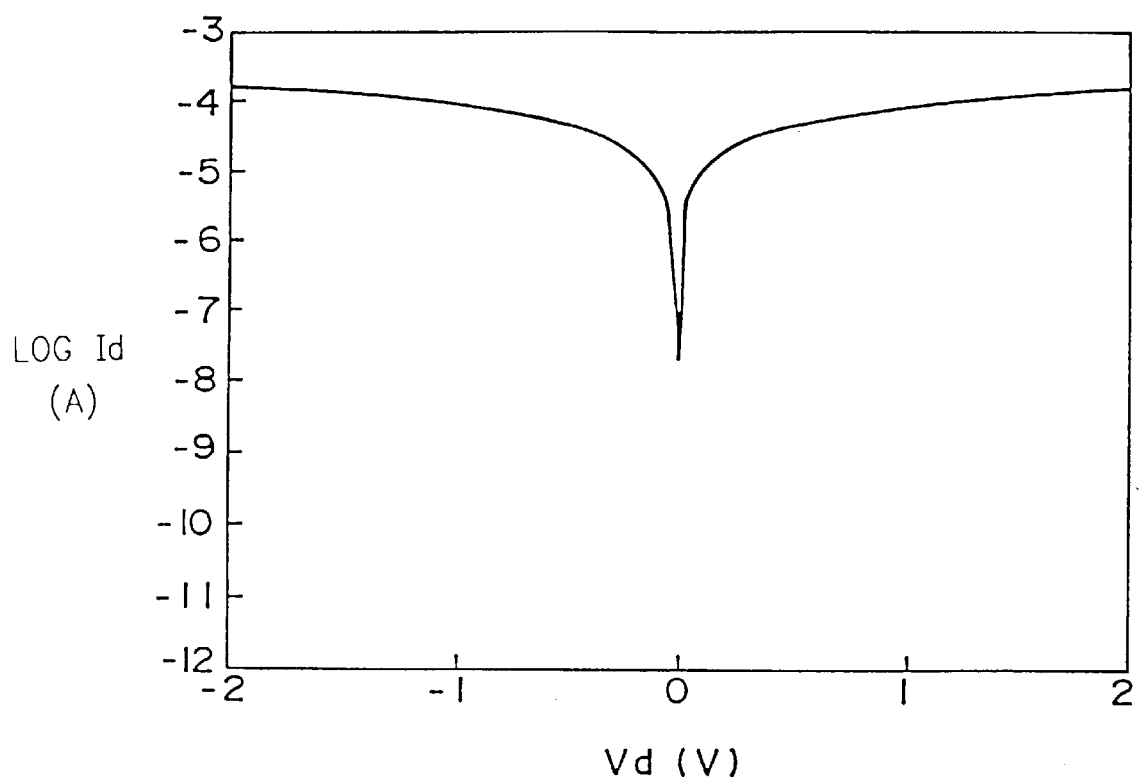
FIG. 2 is a view showing current-voltage characteristics of a contact.
Figure 21:
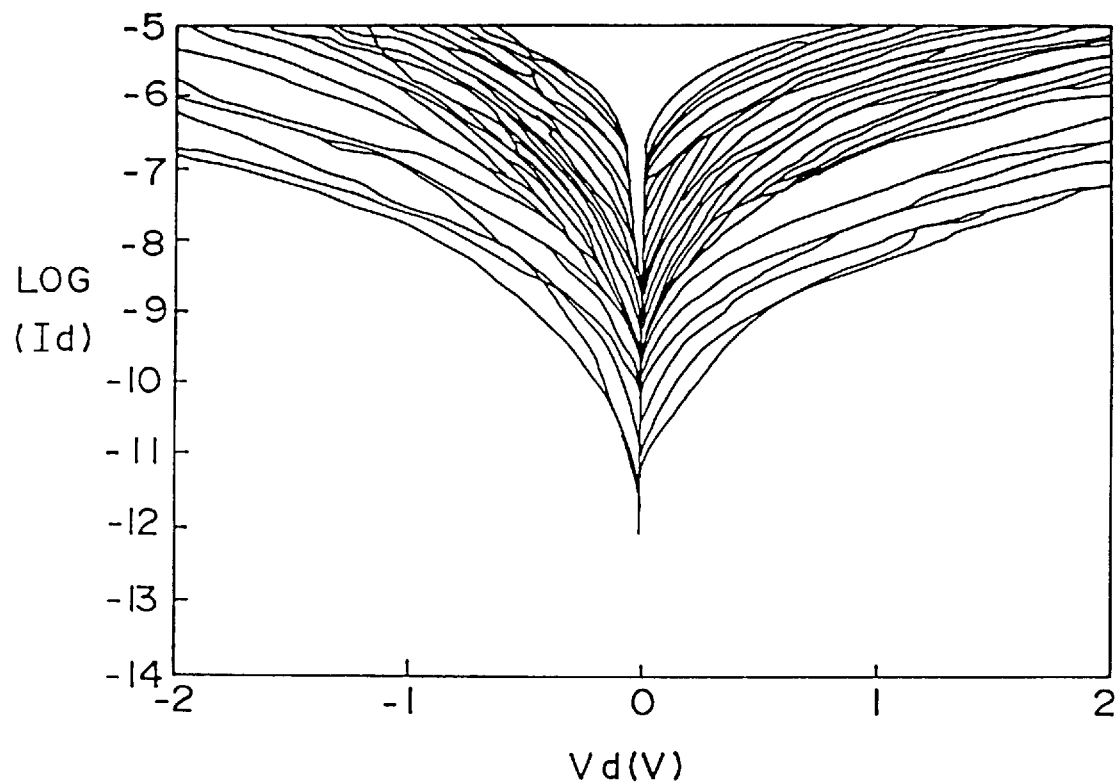
FIG. 21 is a view showing current-voltage characteristics of a contact of the second background example.

In addition, in the above-described second background example, since the PLYD and the AL offer the contact at the side surface, the contact resistance varies considerably as shown in FIG. 21. In contrast, according to this embodiment, as shown in FIG. 2, there are almost no variations in the contact resistance, and current supplying ability is, for example, Id is $10^{-5}$ A when Vd=0.1v. That is to say, the ON-state current of one TFT is about $10^{-8}$ A and does not limit the current of the TFT. Therefore, according to this embodiment, excellent data retention properties making full use of properties of the TFT can be obtained.

(2) Other characteristics of this embodiment

Figure 3:
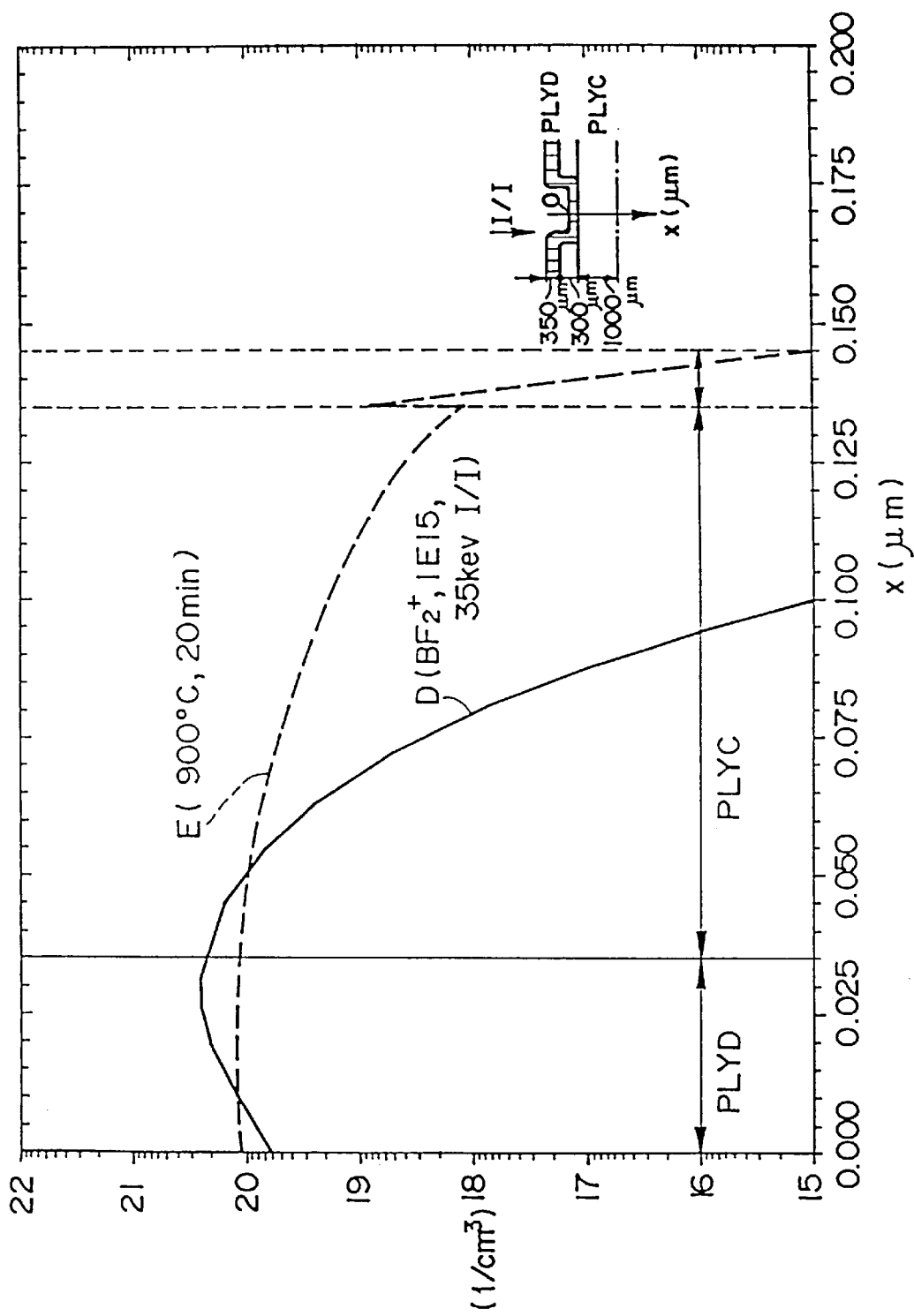
FIG. 3 is a view showing a concentration profile of impurities.

1) In this embodiment, the P-type impurities introduced into the PLYD (14) are diffused to the non-doped regions 18b, 18c of the PLYC (18) using a given heating step. For example, in FIG. 3D, there is shown a concentration profile when $BF_2^+$ is ion-implanted under the condition of 35 keV and $1 \times 10^{15}/cm^2$, and in FIG. 3E, there is shown a concentration profile when heat treatment for flattening a BPSG film of an insulating layer by reflowing after the ion implantation is effected in $N_2$ atmosphere for 20 minutes at 900° C. Apparently from FIGS. 3D and 3E, by effecting heat treatment, the concentration of impurities can be sufficiently increased even at the position where the distance x in a depthwise direction is great. For example, a case may be considered in which the PLYD (14) penetrates and the PLYC (18) undergoes over-etching in FIG. 1. In this case, if the concentration profile is that shown in FIG. 3D, there is a possibility that ohmic contact between the region 18c, the AL (10) and the PLYD (14) can't be maintained, so that the contact resistance increases. On the other hand, if heat treatment is effected to obtain the concentration profile as shown in FIG. 3E, ohmic contact can be maintained even if the PLYC (18) undergoes over-etching, whereby increase and variation in the contact resistance can be prevented.

In this embodiment, this heating step doubles as a heating step for activating the P-type impurities introduced into the PLYD (14) and diffused to the PLYC (18). By activating the P-type impurities, carrier density can be increased and sheet resistance of the PLYD (14) and PLYC (18) can be reduced, whereby a drop in the power voltage supplied to the memory cells can be prevented, and the memory cells can be operated at a low voltage.

Figure 1:
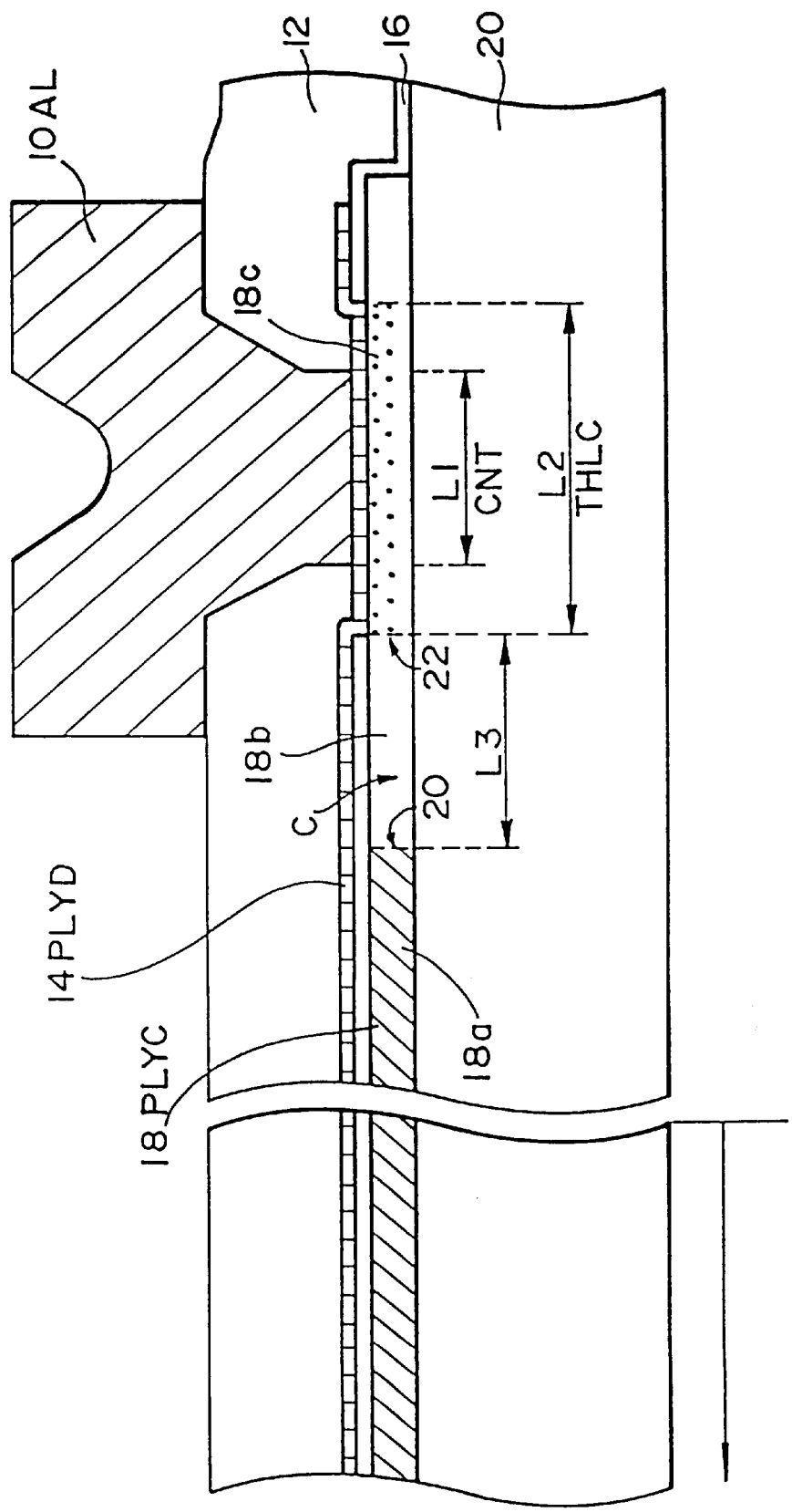
FIG. 1 is a view showing a sectional configuration of an embodiment 1 of the present invention.

2) In this embodiment, as shown in FIG. 1, the N-type impurities are introduced into the PLYC (18) in a certain area of the memory cells. The introduction of the N-type impurities can bring the PLYC (18) into conduction, whereby it becomes possible to utilize the PLYC (18) for the gate electrodes of the TFTs, the conductive layer in the memory cells, and so on. In this embodiment, it is also possible to prepare an etching stopper layer which is used specifically for the prevention of penetration. However, if the PLYC is used as the gate electrode and conductive layer in the memory cell area and as the etching stopper layer in the CNT forming area, an advantage can be obtained in that it becomes unnecessary to increase new steps for forming the etching stopper layer.

3) In this embodiment, as shown in FIG. 1, it is preferable to set L3 to 1.5 μm or more where the distance between a boundary 20 of the region 18a into which N-type impurities are introduced and the non-doped region 18b, and an end 22 of the THLC is L3. This can prevent situations such that the N-type impurities in the region 18a are diffused to the region 18c to increase contact resistance, and that punch-through occurs between the N-type region and the P-type region.

Incidentally, the PLYC of the memory cell area and the PLYC of the CNT forming area may be separated in terms of patterns (for example, separated at a portion indicated by C of FIG. 1) to form a separated layout. This can also prevent the N-type impurities of the PLYC in the memory cell area from diffusing to the PLYC in the CNT forming area.

4) In this embodiment, the following relation holds:

THLC diameter (L2)>CNT diameter (L1)+2×alignment error (alignment error: alignment allowance of THLC and CNT)

This can prevent the side-surface contact of the PLYD (14) and the AL (10). It is preferable that the CNT is formed to have a minimum diameter permitted by design rule, and the THLC is formed to have a minimum diameter by which the above expression holds, because this can optimize the area of the CNT forming area and optimize the chip area.

(3) Example of Memory Cell Construction

Figure 5A:
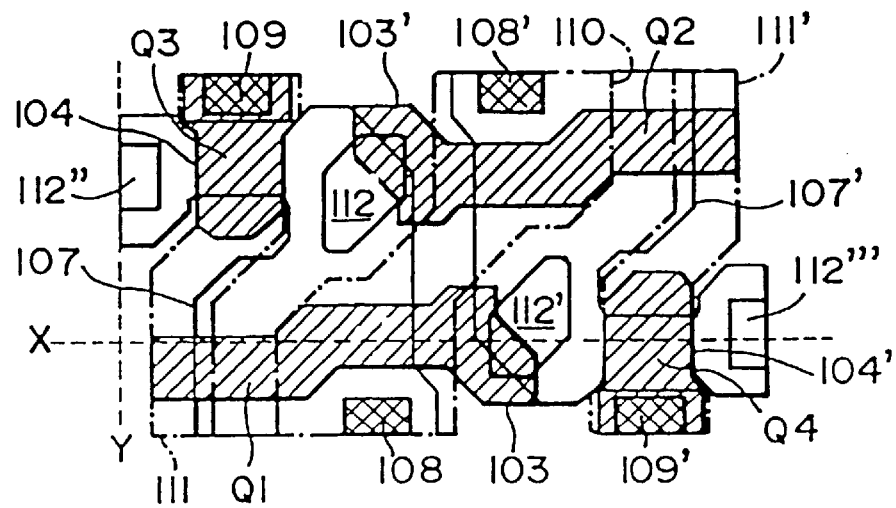
FIGS. 5A to 5C are examples of plan views of the memory cell.
Figure 5B:
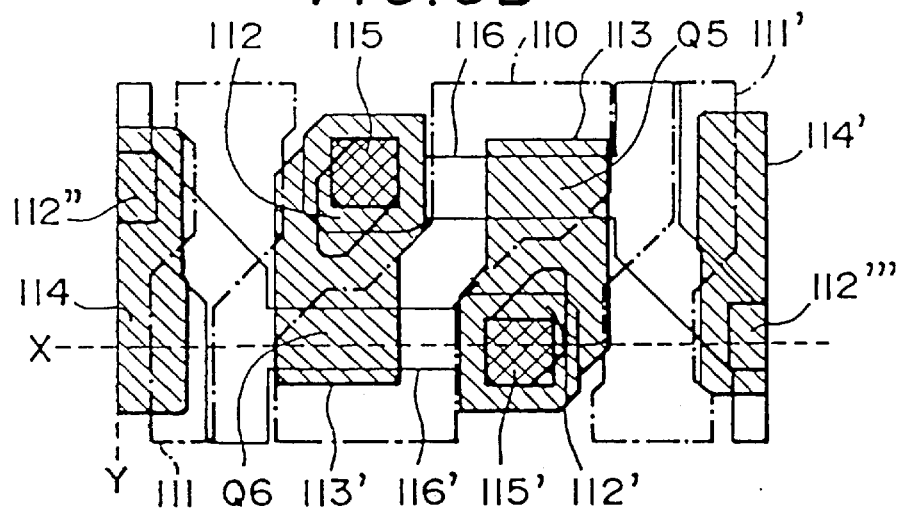
Figure 5C:
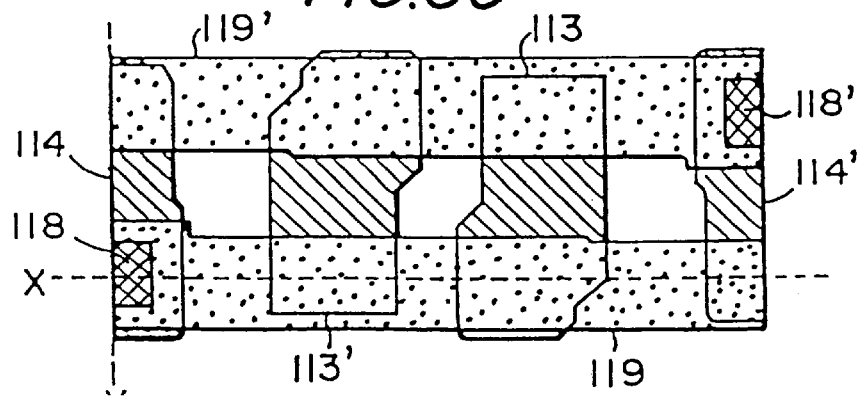
Figure 6:
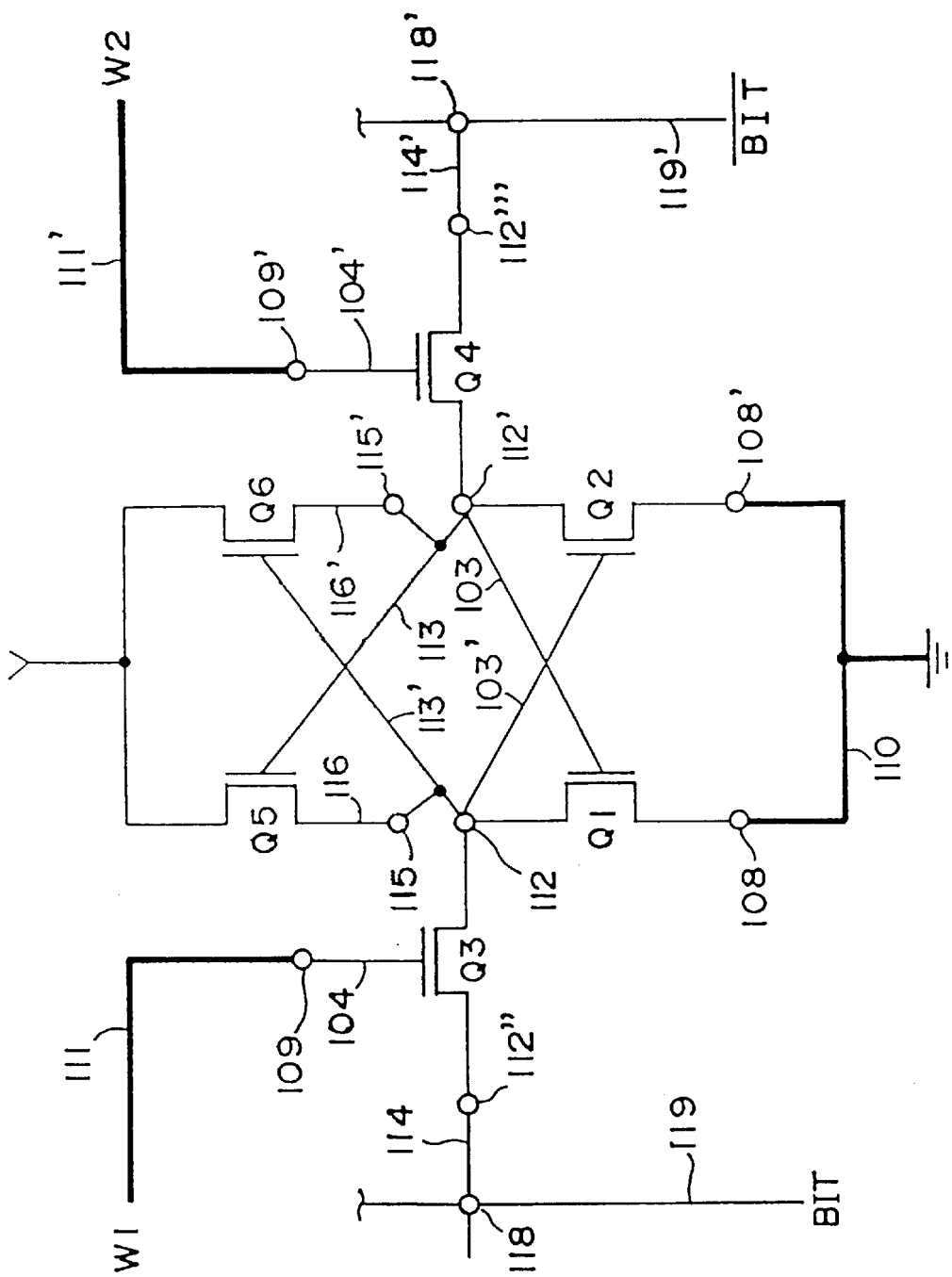
FIG. 6 is an example of equivalent circuit diagram of the memory cell.

An example of the memory cell of this embodiment will be described with reference to a sectional view of FIG. 4, plane views of FIGS. 5A to 5C and an equivalent circuit diagram of FIG. 6.

As shown in these drawings, this memory cell includes a flip-flop circuit having driver transistors Q1, Q2, and TFTs Q5, Q6, and transfer transistors Q3, Q4. The characteristic of this embodiment is that, as indicated by thick lines in FIG. 6, a gate electrode 104 of the Q3 of adjacent memory cells is connected by a first wordline 111, a gate electrode 104' of the Q4 of adjacent memory cells is connected by a second wordline 111', and the first and second wordlines 111, 111' are formed by the same wiring layer as that of a ground line 110.

In this memory cell, the gate electrodes 103, 103' of the driver transistors Q1, Q2 and the gate electrodes 104, 104' of the transfer transistors Q3, Q4 are formed by the first (lowermost) polycrystalline silicon layer PLYA.

The ground line 110 formed by the second polycrystalline silicon layer PLYB is connected to source regions of the Q1, Q2 through contact holes 108, 108'. In addition, the first and second wordlines 111, 111', which are formed similar to the ground line, are connected to the gate electrodes 104, 104' of the Q3, Q4 formed by the PLYA through contact holes 109, 109'.

A gate electrode 113 of the TFT Q5 formed by the third polycrystalline silicon layer PLYC is connected to drain regions of the Q2 and Q4, and to the gate electrode of the Q1 through a contact hole 112'. A gate electrode 113' of the TFT Q6 formed also by the PLYC is connected to drain regions Q1 and Q3, and to the gate electrode Q2 through a contact hole 112. In addition, bitline drawer electrodes 114, 114' formed by the PLYC are connected to source regions of the Q3, Q4 through contact holes 112", 112'''.

Bulks 116, 116' of the TFT Q5, Q6 formed by the fourth polycrystalline silicon layer PLYD are connected to the gate electrodes 113', 113 of the TFT Q6, Q5 through contact holes 115, 115'.

Bitlines 119, 119' formed by AL are connected to the bitline drawer electrodes 114, 114' formed by the PLYC through contact holes 118, 118'.

As described above, the PLYD (14), which becomes the power supplying line in FIG. 1, becomes the bulk (source, drain and channel regions) of the TFT in the memory cell area. And, the PLYC (18), which becomes the etching stopper layer, becomes the gate electrodes of the TFT in the memory cell area. Since the TFT is the P-channel transistor, it is necessary to make its bulk (except for channel region) P-type, and hence the PLYD (14) becomes the P-type. In addition, as shown in FIG. 4, the gate electrode 113 of the TFT is directly connected to a drain region 107' of the drive transistor Q4. Since the drive transistor Q4 is the N-channel transistor, its drain region 107' becomes also an N-type active area. Therefore, it is necessary to make the gate electrode of the TFT directly connected to this N-type active area N-type, and the PLYC (18) also becomes the N-type. When the PLYC (18), which becomes the N-type at a structural request of the memory cell as described above, is used as the etching stopper layer in the CNT forming area, a parasitic diode is generated on the power supplying line. In this embodiment, the N-type PLYC is non-doped in the CNT forming area thereby to solve the above-described problem. This makes it possible to use surely the PLYC (18), which is used for the gate electrode of the TFT, as the etching stopper layer.

Figure 4:
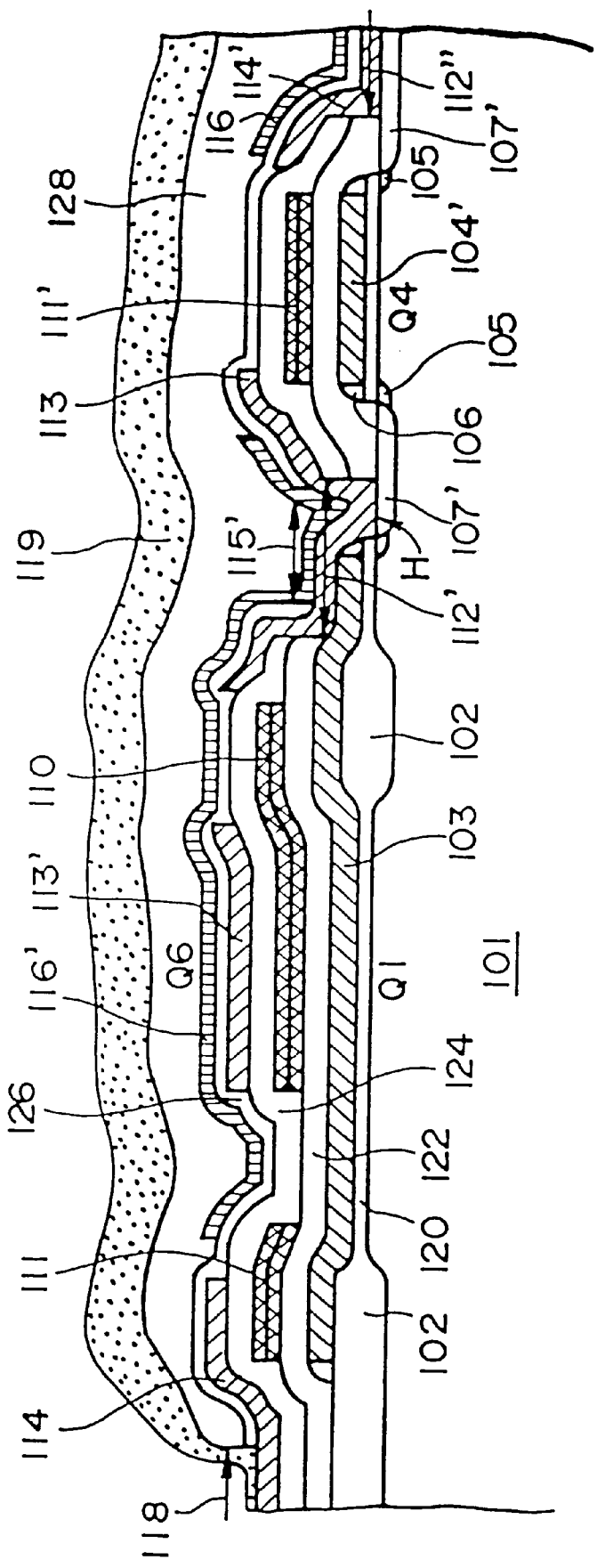
FIG. 4 is an example of a sectional view of a memory cell.

Although the TFTs are used as load transistors in the memory cell shown in FIG. 4, a gate electrode forming step, and so on, may be omitted and the kinds of impurities implanted to the bulk of the TFTs may be changed so that the TFTs can be used as load resistance. In this case, the etching stopper layer may be formed by the other wiring layer, such as the first polycrystalline silicon layer. In addition, the wordlines and ground line can be provided above the TFTs.

Figure 7A:
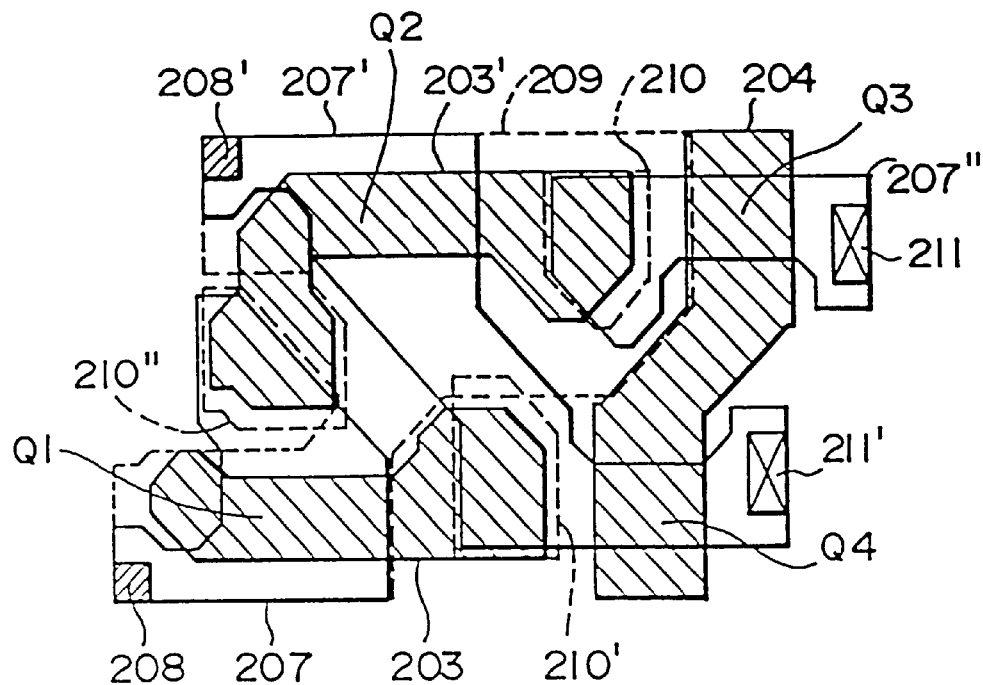
FIGS. 7A, 7B are examples of plan views of the memory cell.
Figure 7B:
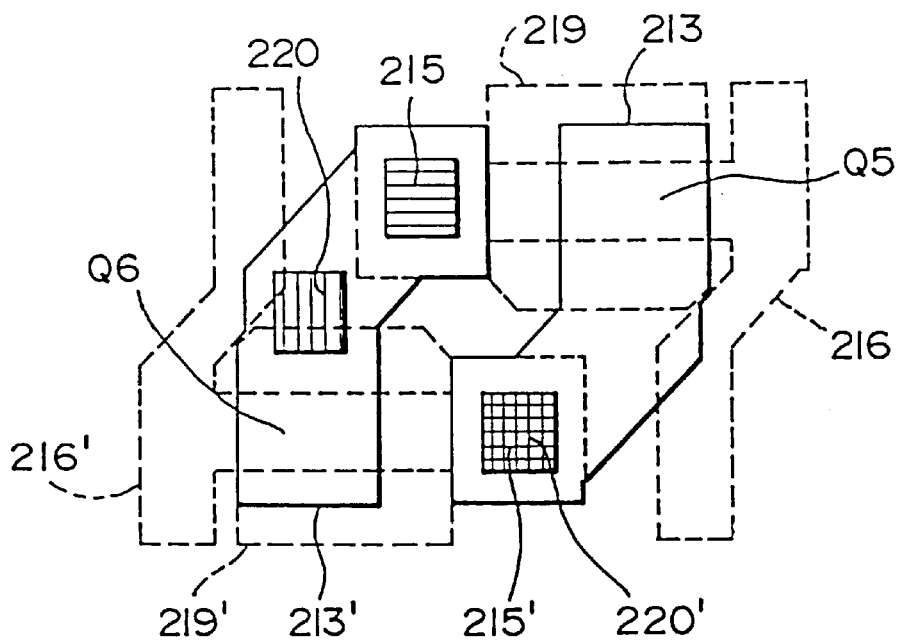

Further, as the memory cell of this embodiment, those having various structures, for example, shown in FIGS. 7A and 7B may be used in addition to one shown in FIG. 4.

FIG. 7A will be described. By active areas 207, 207', 207" and gate electrodes 203, 203', 204 comprised of the PLYA, the drive transistors Q1, Q2 and the transfer transistors Q3, Q4 are formed. Ground power is provided to the source regions of the Q1, Q2 through a ground line 209 comprised of the PLYB and contact holes 208, 208'. Contact holes 210, 210', 210" are buried contacts, and used for connecting the active areas which form storage nodes and the gate electrodes of the driver transistors. Contact holes 211, 211' are bitline contacts.

Next, FIG. 7B will be described. By gate electrodes 213, 213' formed by the PLYC and bulks 216, 216' formed by the PLYD, the TFT Q5, Q6 are formed. The PLYC is the N-type, and the P-type impurities are introduced (doped) into the PLYD except for its channel region. Implanted data masks 219, 219' are used for this selective doping. Contact hole 220, 220' connect the gate electrodes 213', 213 of the TFT comprised of the PLYC and the gate electrodes 203' 203 of the drive transistors comprised of the PLYA. Contact holes 215, 215' connect the gate electrodes 213', 213 of the TFT comprised of the PLYC and the bulks 216, 216' of the TFTs comprised of the PLYD.

(4) Manufacturing Method

Next, a manufacturing method of the first embodiment will be described with reference to flow sectional views of 8A to 8D and 9A to 9C.

Since the forming step of the insulating layer between the PLYB and the PLYC and thereafter are characteristics of this embodiment, former processes are omitted, and the description will be started from the next stage.

Figure 8A:
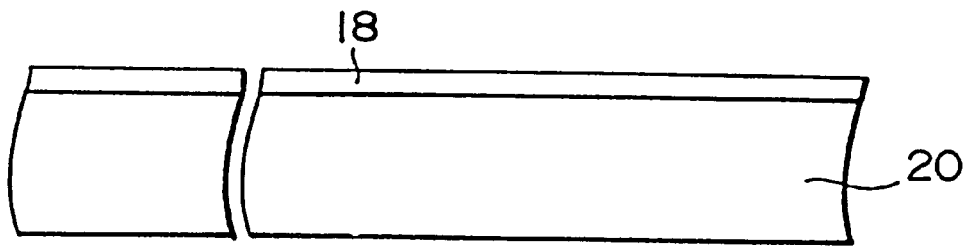
FIGS. 8A to 8D are flow sectional views for explaining a manufacturing method of the embodiment 1.

1) First, by applying an LPCVD method, a PLYC (18) having a thickness, for example, of 1000 angstroms is formed. At this time, a PLYC (18) is a non-doped polycrystalline silicon layer (see FIG. 8A).

Figure 8B:
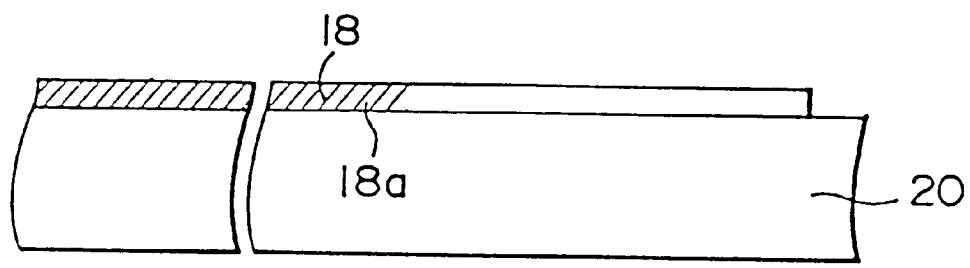

2) A photoresist film, which is coated so that the N-type impurities get into the memory cell area, undergoes patterning using a lithographic technique. And, the above photoresist film is used as a mask and the N-type impurities are implanted to the PLYC (18) by applying ion implantation method to form the region 18a into which the N-type impurities are introduced. Thereafter, the photoresist film used at the time of ion implantation is removed. Next, by applying a resist process in the lithographic technique and an RIE method in which etching gas is $CCl_4+O_2$, a patterning of the PLYC (18) is effected (see FIG. 8B).

Figure 8C:
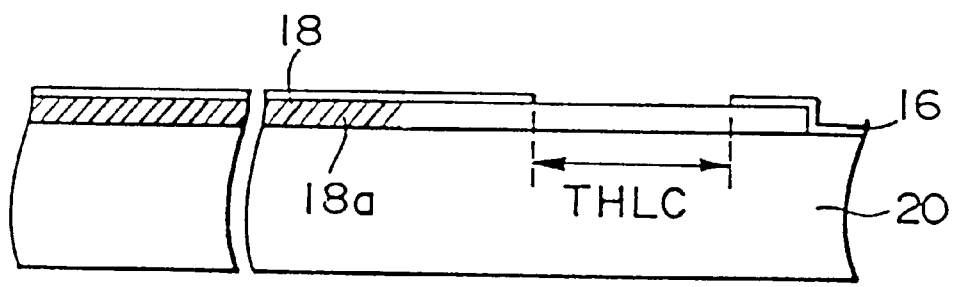

3) By applying a CVD method, an insulating layer 16 comprised of $SiO_2$ having a thickness of, for example, 300 angstroms is formed. By applying the resist process in the lithographic technique and the RIE method in which the etching gas is $CHF_3$, a selective etching of the insulating layer comprised of $SiO_2$ is effected to form the THLC (see FIG. 8C).

Figure 8D:
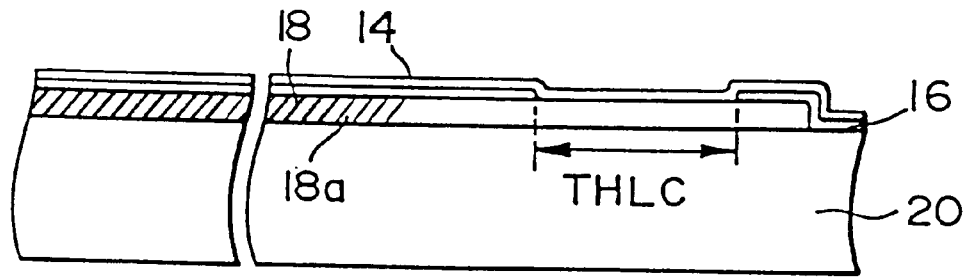

4) By applying the LPCVD method, a PLYD (14) having a thickness of, for example, 300 angstroms is formed. At this time, the PLYD (14) is comprised of a non-doped polycrystalline silicon layer or an amorphous silicon layer (see FIG. 8D).

5) By applying the resist process in the lithographic technique and the ion implantation method, the P-type impurity ions are implanted to the source region and drain region of the TFT, and the area which is to be the power supplying line. At this time, the condition is mentioned such that $BF_2^+$ is implanted in $1\times10^{14}$ to $1\times10^{15}/cm^2$ at 20 keV to 40 keV.

Figure 9A:
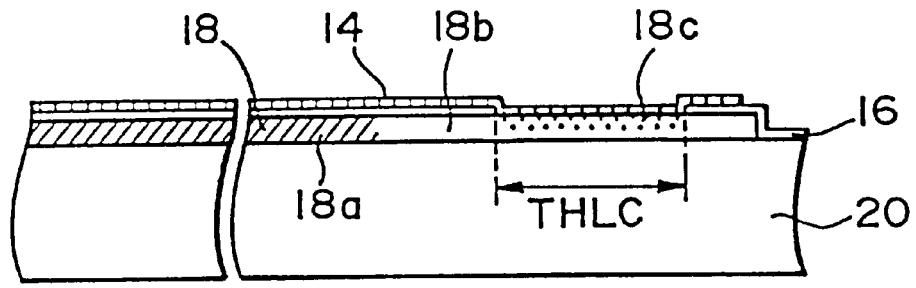
FIGS. 9A to 9C are also flow sectional views for explaining a manufacturing method of the embodiment 1.

The P-type impurities implanted to the PLYD (14) is diffused in the PLYC (18) through a THLC portion by a heat treatment in subsequent processes, whereby the region 18c of the non-doped regions 18b, 18c becomes the region in which the P-type impurities are diffused (see FIG. 9A).

Figure 9B:
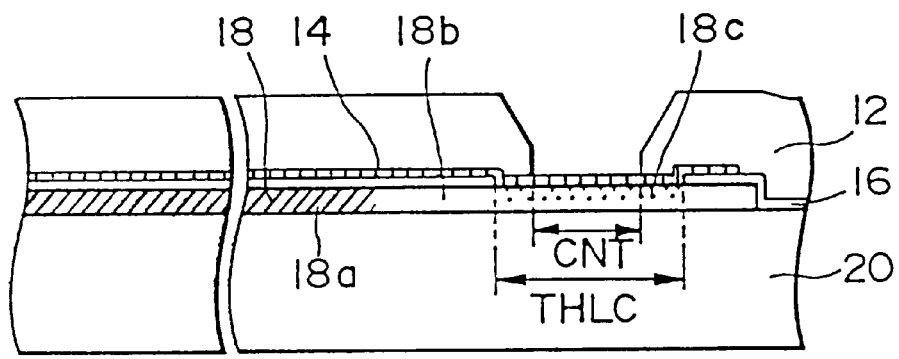
Figure 9C:
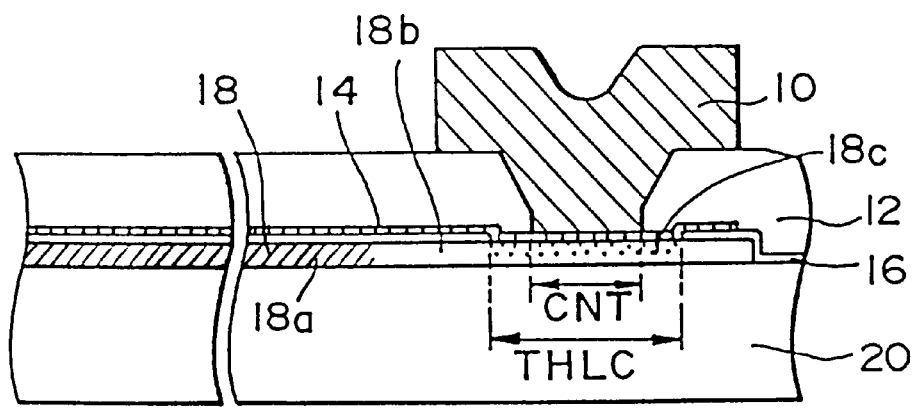

6) By applying the LPCVD method, an insulating layer comprised of $SiO_2$ having a thickness of, for example, 500 angstroms, and an insulating layer comprised of the BPSG having a thickness of, for example, 3000 angstroms are formed. In FIGS. 9B and 9C, these insulating layers are combined and represented as an insulating layer 12. Next, heat treatment for flattening a BPSG film of the insulating layer 12 by reflowing is effected in $N_2$ atmosphere for about 20 minutes at 800° C. to 900° C. Then, the etching of the insulating layer 12 is effected by the resist process in the lithographic technique and wet etching method for making tapers, and further the RIE method in which etching gas is $CHF_3$ to form the CNT (see FIG. 9B).

7) By applying a sputtering method, an AL (10) having a thickness of, for example, 1 μm is formed, and this is subjected to the patterning by applying a normal photolithographic technique and etching to form signal wiring and power lines. Incidentally, the AL (10) can replace a W film and a TiN film, and the sputtering method can replace the CVD method (see FIG. 9C).

It is a characteristic of this embodiment that the THLC is formed on non-doped regions of the PLYC to diffuse the P-type impurities from the PLYD, thereby preventing generation of the reverse-direction parasitic diode.

Apparently from the explanation of this embodiment as described above, the N-type impurities are not selectively introduced into the regions 18b, 18c which are non-doped in this description, and after undergoing the given heating step, the P-type impurities are contained at least in the region 18c in which the contact hole THLC is formed.

A second embodiment of the present invention will be described with reference to FIG. 10.

In this embodiment, an AL (310, first wiring layer), which is a power line, and a PLYD (314, second wiring layer) are directly connected by a CNT. In a forming area of the CNT (first contact hole), an insulating layer 320 below the PLYD (314) is formed into a concave shape, and it is a characteristic of this embodiment that the height of the PLYD (314) from the surface of the semiconductor substrate in the CNT forming area is lower than the height in the area other than the CNT forming area. According to this embodiment, the height of the PLYD (314) viewed from the semiconductor substrate surface can be lowered, so that a thickness D3 of an insulating layer 312 in the CNT forming area can be made thicker than D4, whereby penetration of the PLYD (314) can be effectively prevented. The reason why the penetration does not occur will be described using numerical values in the explanation of a manufacturing method.

In addition, the other characteristic of this embodiment is to form the above-described concave shape using a forming step of the contact hole (e.g. the THLC, etc.) for connecting the PLYD (314) and the other layer below the PLYD. This can form the concave shape without adding new steps. Particularly, according to this embodiment, by utilizing the etching selectivity between the insulating layer and the above-described other layer, the concave shape is easily formed.

Next, a manufacturing method of the second embodiment will be described with reference to flow sectional views of 11A to 11D and 12A to 12C. It is a main part of this embodiment to form the concave shape in the insulating layer below the PLYD using the forming step of the THLC, and the characteristic of this embodiment lies in the forming step of the insulating layer between the PLYB and the PLYC and thereafter. Therefore, former processes are omitted, and the description will be started from the next stage.

Figure 11A:
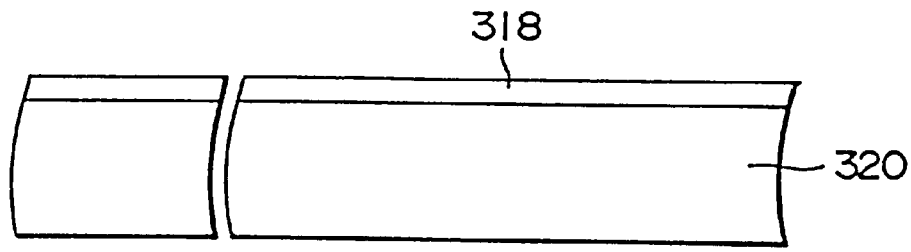
FIGS. 11A to 11D are flow sectional views for explaining a manufacturing method of the second embodiment.

1) First, by applying the LPCVD method, a PLYC (318) having a thickness of, for example, 1000 angstroms is formed. At this time, the PLYC (318) is comprised of a non-doped polycrystalline silicon (see FIG. 11A).

Figure 11B:
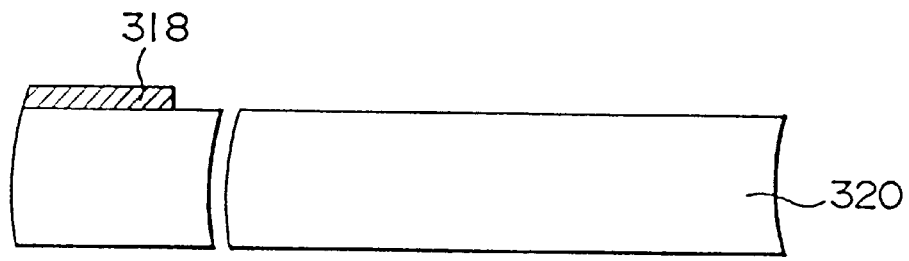

2) N-type impurities are introduced into the whole surface of the PLYC (318), and by applying the resist process in the lithographic technique and the RIE method in which the etching gas is $CCL_4+O_2$, a patterning of the PLYC is effected (see FIG. 11B).

Figure 11C:
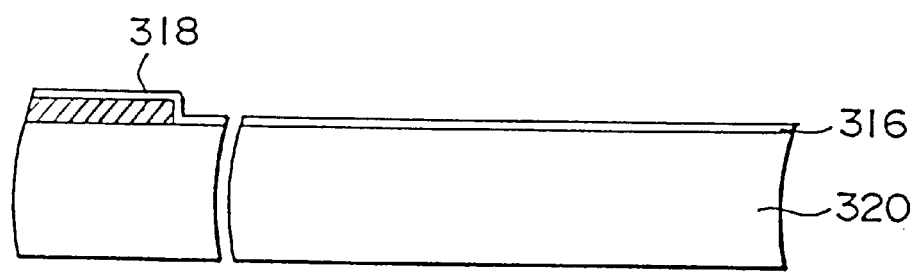
Figure 11D:
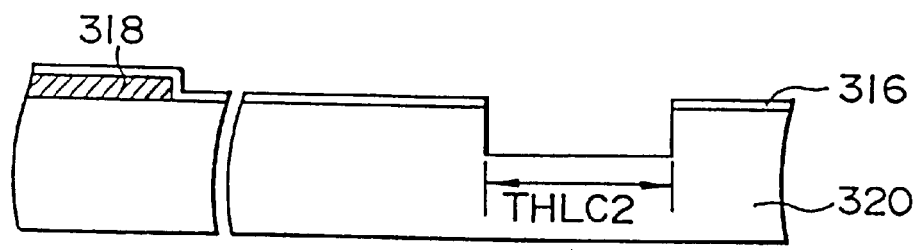

3) By applying the CVD method, an insulating layer 316 comprised of $SiO_2$ having a thickness of, for example, 300 angstroms is formed (see FIG. 11C).

4) By applying the resist process in the lithographic technique and the RIE method in which the etching gas is $CHF_3$, a selective etching of the insulating layer comprised of $SiO_2$ is effected to form the concave shape (hereinafter, referred to as THLC2).

Figure 13:
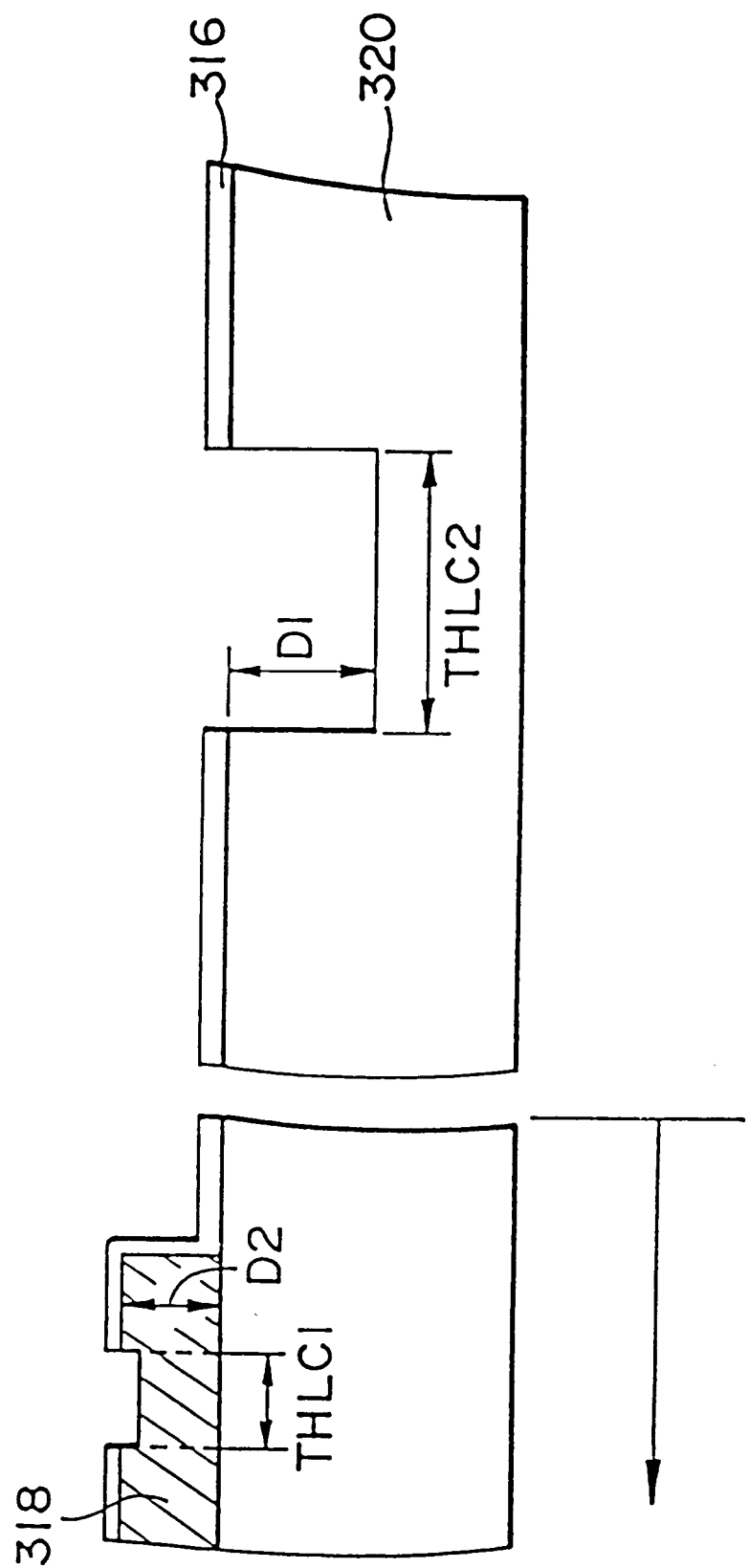
FIG. 13 is a view for explaining a forming technique of a concave shape.

In this embodiment, the concave shape is formed by using a contact hole, for example, the THLC forming step for connecting the PLYD (314) and the layer below the PLYD, for example, a PLYC (318). As shown in FIG. 13, by the THLC forming step, a THLC1 is formed in the memory area. This THLC1 connects the PLYD (314) and the PLYC (318), corresponding to the contact holes 115, 115' in the memory cell constructed as shown in FIG. 4 and FIGS. 5A to 5C.

At this time, in this embodiment, the concave shape is formed utilizing the etching selectivity between the PLYC (318) and the insulating layer 320. That is to say, as shown in FIG. 13, the PLYC (318) is formed in the area of the THLC1, while the PLYC is not formed in the area of the THLC2. Thus, the depth of a hole in the THLC2 becomes deep, and an etching depth D1 in the THLC2 forming area is 1500 angstroms under the conditions of, for example, etching rate of the $SiO_2$ is 100 angstroms/sec, and etching time is 15 sec. In this etching condition, an etching selection ratio of Si to $SiO_2$ about 1:10 is usually obtained. Therefore, in the THLC1 forming area under which the PLYC (318) exists, occurrence of the penetration of the PLYC (318) is prevented. Here, the etching depth at the THLC1 is taken as D1, the etching election ratio of the PLYC (318) to the insulating layer 320 (the etching selection ratio of Si to $SiO_2$) is taken as 1:K and the thickness of the PLYC (318) is taken as D2. By effecting dry etching while adjusting in the range of D1<D2×K, it becomes possible to obtain the concave shape of an arbitrary depth while preventing the penetration of the PLYC (318).

5) By applying the LPCVD method, a PLYD (314) having a thickness of, for example, 300 angstroms is formed. At this time, the PLYD is comprised of a non-doped polycrystalline silicon layer or an amorphous silicon layer.

Figure 12A:
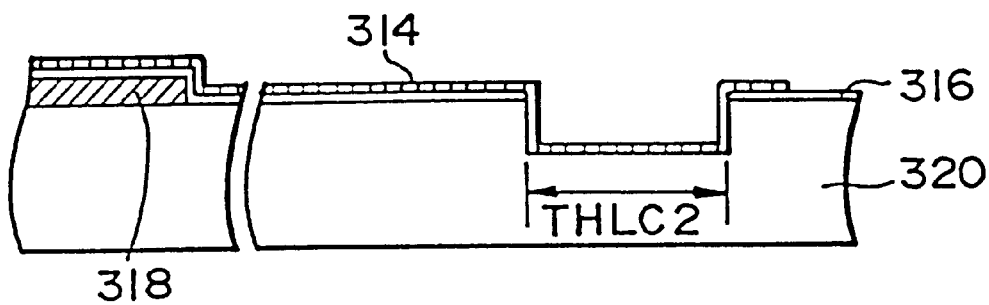
FIGS. 12A to 12C are also flow sectional views for explaining a manufacturing method of the second embodiment.

By applying the resist process in the lithographic technique and the ion implantation method, the P-type impurity ions are implanted to the source region and drain region of the TFT, and the region which is to be the power supplying line. By applying the resist process in the lithographic technique and the RIE method in which the etching gas is $CCl_4+O_2$, a patterning of the PLYD (314) is effected (see FIG. 12A).

Figure 12B:
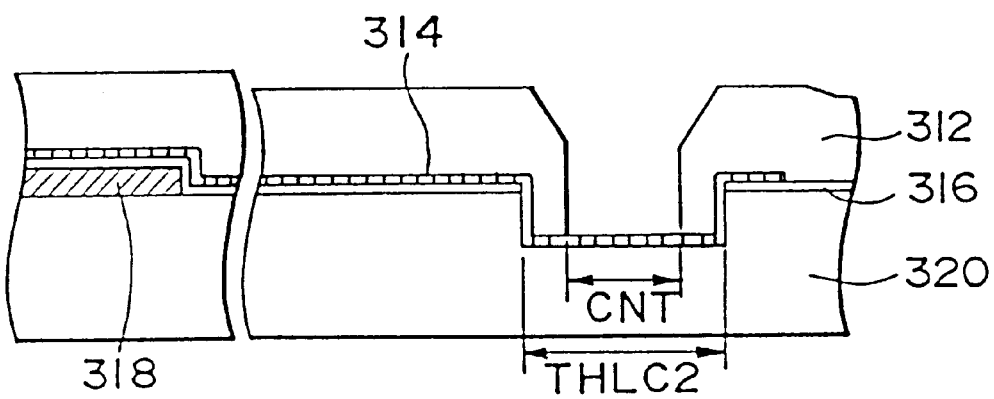
Figure 12C:
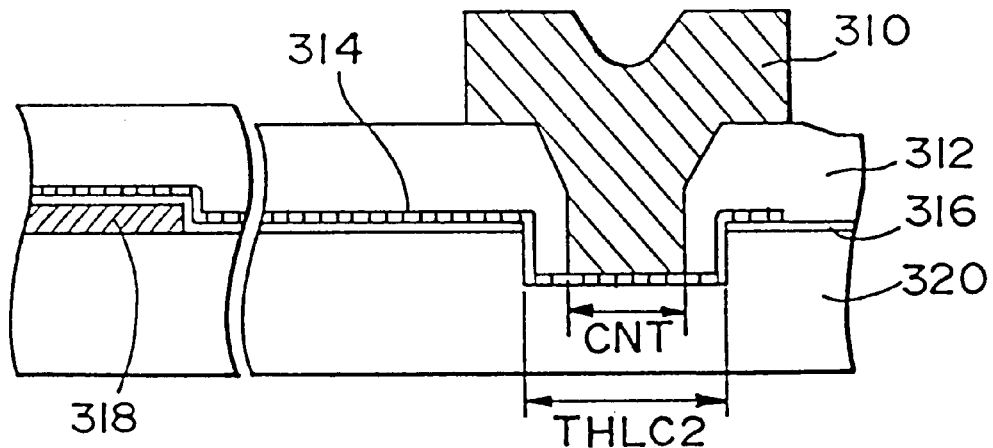

6) By applying the LPCVD method, an insulating layer comprised of $SiO_2$ having a thickness of, for example, 500 angstroms, and an insulating layer formed of the BPSG having a thickness of, for example, 3000 angstroms are formed. In FIGS. 12B and 12C, these insulating layers are combined and represented as an insulating layer 312.

Next, heat treatment for flattening the BPSG of the insulating layer 312 by reflowing is effected. The deep hole of the concave shape is formed in the CNT forming area, so that the BPSG is collected in the hole of the concave shape by reflow of the BPSG, whereby the insulating layer 312 becomes thicker than the other portions.

Figure 14A:
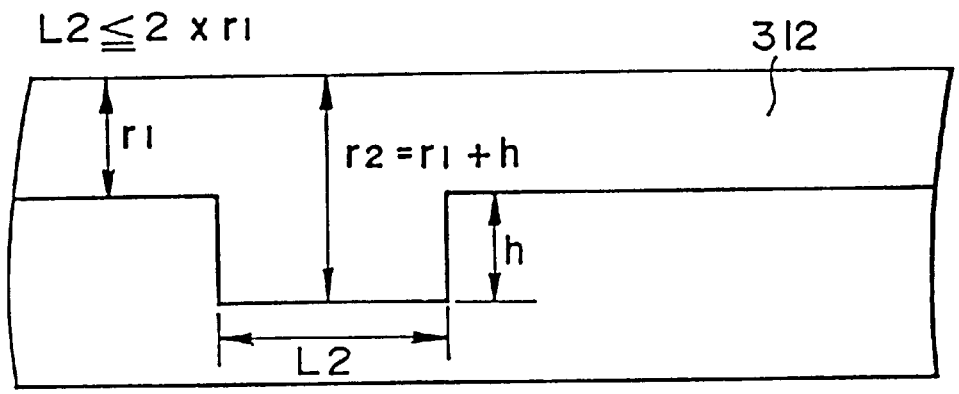
FIGS. 14A to 14C are views for explaining a relation between L2, γ1 and γ2.
Figure 14B:
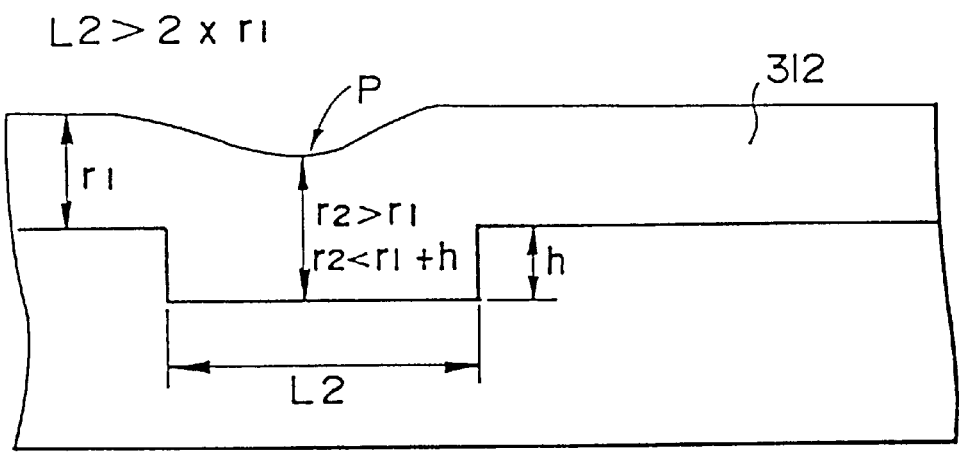
Figure 14C:
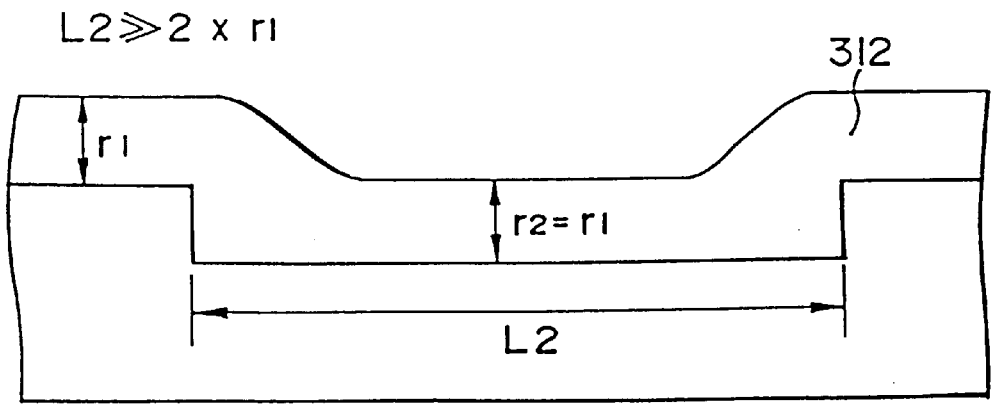

Here, as shown in FIG. 14A, it is preferable that L2 is $2\times\gamma 1$ or less where the diameter of the THLC2 (the concave shape) is taken as L2 and the thickness of the insulating layer in the area other than the CNT forming area is $\gamma 1$. By setting the L2 to this extent, the BPSG can be sufficiently collected in the concave-shaped hole at the time of reflowing of the BSPG, whereby the thickness $\gamma 2$ of the insulating layer 312 in the CNT formation area can be made larger than $\gamma 1$ to satisfy $\gamma 2=\gamma 1+h$ (depth of the concave shape). In contrast, as shown in FIG. 14B, when L2 becomes larger than $2\times\gamma 1$, $\gamma 2$ becomes larger than $\gamma 1$, but smaller than $\gamma 1+h$, so that a depression indicated by P is produced. In addition, as shown in FIG. 14C, when L2 increases to be extremely larger than $2\times\gamma 1$, it will become $\gamma 2=\gamma 1$. As described later, in this embodiment, the penetration of the PLYD is prevented by thickening the thickness $\gamma 2$ of the insulating layer 312 in the CNT forming area. Thus, it is necessary to make $\gamma 2$ larger than $\gamma 1$, and for this reason, it is preferable to satisfy the condition of $L2 \leq 2\times\gamma 1$, as shown in FIG. 14A.

Figure 10:
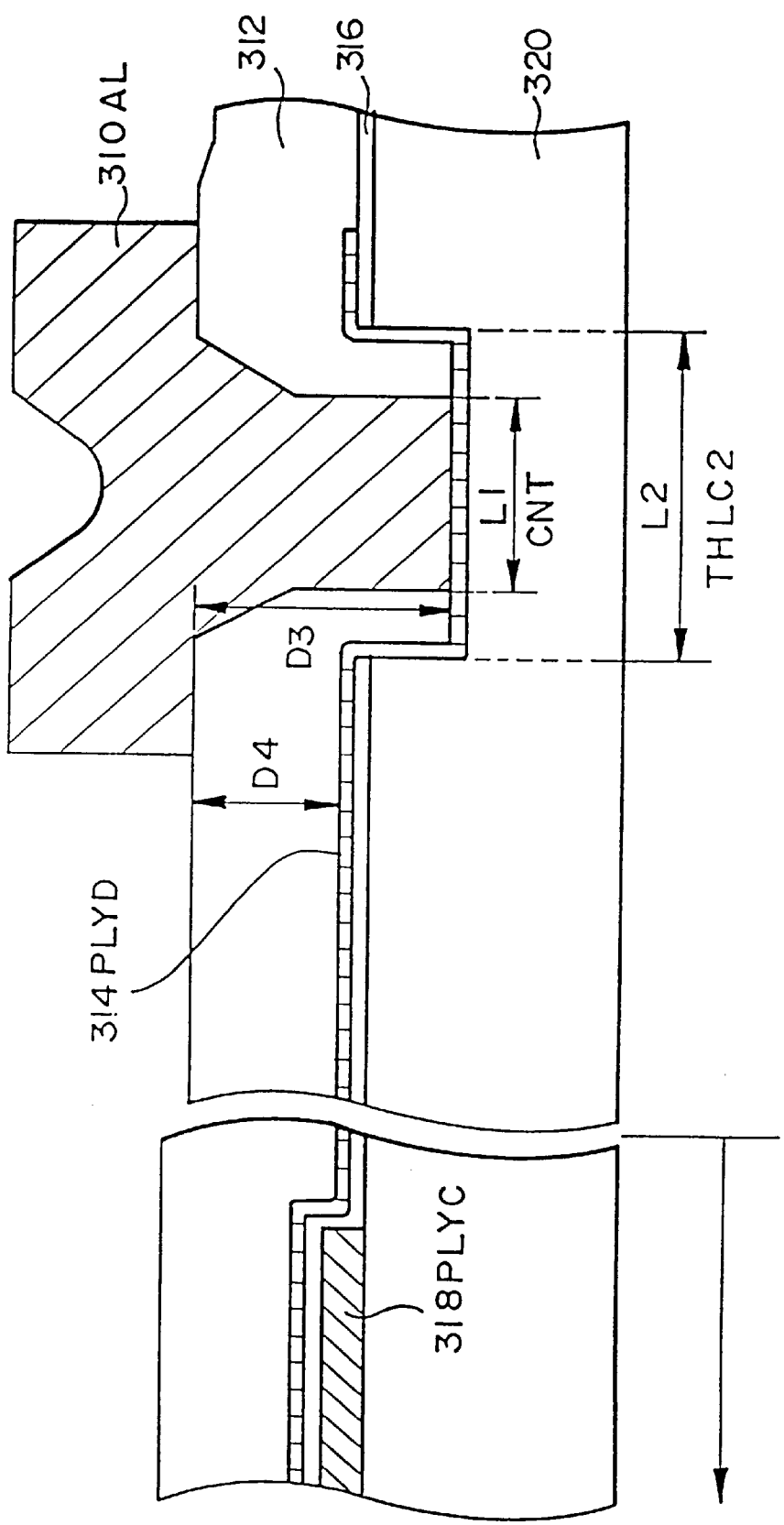
FIG. 10 is a view showing a sectional configuration of a second embodiment.

And, as shown in FIG. 10, it is preferable to satisfy the following expression where the diameter of the CNT is L1:

THLC2 diameter (L2)=CNT diameter (L1)+2×alignment error
(alignment error: alignment allowance of THLC2 and CNT).

By doing this, and by forming the CNT diameter (L1) in the minimum size in terms of design rule, the diameter L2 of the THLC2 can be minimized. This facilitates the BPSG to be collected in the hole of concave-shape, whereby it becomes possible to prevent the penetration of the PLYD more securely.

After reflowing the BPSG, a selective etching of the insulating layer 312 is effected by the resist process in the lithographic technique and wet etching method for making tapers, and further the RIE method in which the etching gas is $CHF_3$ to form the CNT (see FIG. 12B).

7) By applying the sputtering method, an AL (310) having a thickness of, for example, 1 μm is formed, and this is subjected to the patterning by applying a normal photolithographic technique and etching to form signal wiring and power lines (see FIG. 12C).

According to this embodiment, the height of the PLYD (314) viewed from the semiconductor substrate surface in the CNT forming area can be lowered, whereby the penetration of the PLYD (314) when etching for the formation of the CNT can be prevented.

Figure 15A:
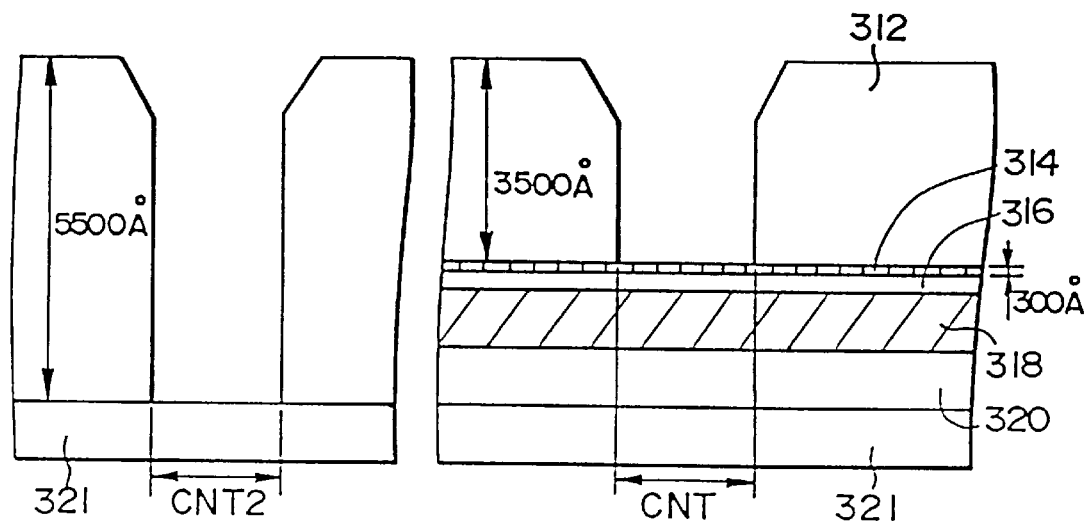
FIGS. 15A, 15B are views for explaining the prevention of penetration when forming a CNT.
Figure 15B:
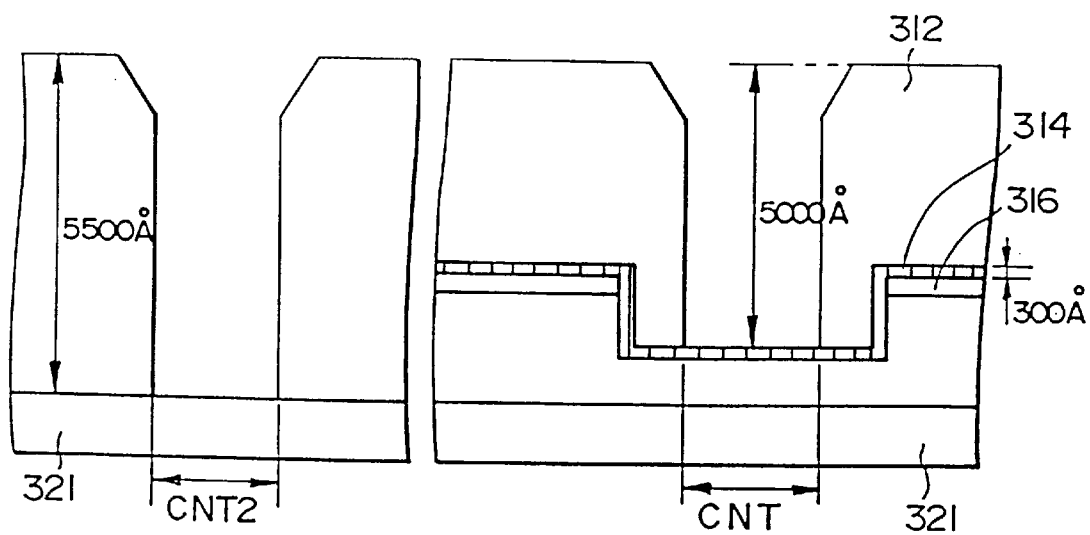

For example, as shown in FIG. 15A, a case may be considered in which a contact CNT2 connecting an AL and an active area 321 is formed in the memory cell area by a forming process of the CNT. The CNT2 corresponds to the contacts 211, 211' (contacts connecting the bitline comprised of AL and the source region of the transfer transistor) of the memory cell shown in FIGS. 7 and 8. At this time, a case may be considered in which the etching selection ratio of the polycrystalline silicon to $SiO_2$ is 1:10, the etching rate of $SiO_2$ is 100 angstroms/sec, the thickness of the insulating layer between the AL and the active area is 5500 angstroms, and the thickness between the AL and the PLYD is 3500 angstroms. In order to take a secure contact of the AL and the active area 321 in the CNT2 forming area, an overetching of about 30% is performed. Then, the etching time will be about 70 sec. At this time, in the case of FIG. 15A, in the forming area of the CNT, penetration occurs in the PLYD (314) and the insulating layer 316 below the PLYD (314) can be shaved about 500 angstroms. On the other hand, according to this embodiment, as shown in FIG. 15B, the thickness of the insulating layer in the CNT forming area can be thickened more than 1500 angstroms, and to the 5000 angstroms or more (when the etching time of the THLC is 15 sec). Therefore, the PLYD (314) can be left at least about 100 angstroms, whereby the penetration can be prevented.

In addition, when contacts connecting the AL and the PLYC (for example, the contacts 118, 118' of the memory cell shown in FIG. 4 and FIGS. 5A to 5C) are formed by the forming step of the CNT, the insulating layer in the CNT forming area can be thickened in this embodiment, whereby the penetration can be effectively prevented.

In this embodiment, although difference in level is formed in the PLYD using a forming step of the THLC, the present invention is not limited thereto. For example, even if a THLB or THLA step is used in the step prior to deposition of the PLYC, the same structure can be realized.

In the above-described second background art, there is a drawback that contact resistance varies considerably because the PLYD and the AL contact at side surface. However, according to this embodiment, the PLYD and the AL are prevented from contacting at the side surface, so that the contact resistance and its variation can be reduced as shown in the above-described FIG. 2, whereby excellent data retention properties can be obtained.

A third embodiment relates to a combination of the first embodiment and the second embodiment, and flow sectional views thereof are shown in FIGS. 16A to 16D, and FIGS. 17A to 17D. A manufacturing method of a forming step and thereafter of an insulating layer 420 between the PLYB and the PLYC will be described below.

1) After the insulating layer 420 comprised of $SiO_2$ has been formed, by applying the resist process in the lithographic technique and the RIE method in which the etching gas is $CHF_3$, a selective etching of the insulating layer 420 is effected to form a concave shape (hereinafter, referred to as THLB2). In this embodiment, the concave shape is formed using a contact hole for connecting a PLYC (418) and a layer below a PLYC, for example, a forming step of a THLB. At this time, in this embodiment, the concave shape is formed by utilizing etching selectivity between the lower layer and the insulating layer 420 (see FIG. 16A).

2) By applying the LPCVD method, the PLYC (418) having a thickness of, for example, 1000 angstroms is formed. At this time, the PLYC (418) is a non-doped polycrystalline silicon layer. Thereafter, using a photoresist film, which is coated so that the N-type impurities get into the memory cell region, by applying ion implantation method, a region 418a into which the N-type impurities are introduced is formed (see FIG. 16B).

Figure 16A:
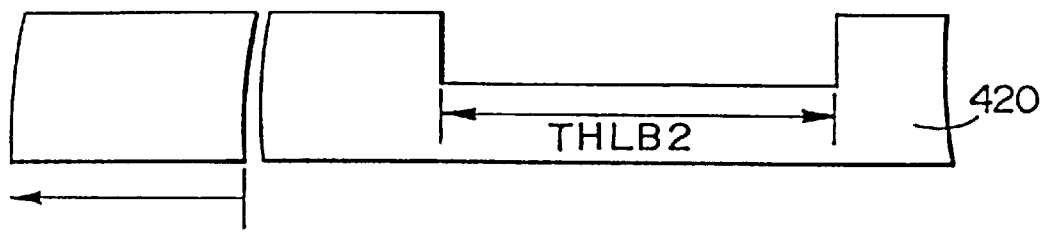
FIGS. 16A to 16D are flow sectional views for explaining a manufacturing method of an embodiment 3 of the present invention.
Figure 16B:
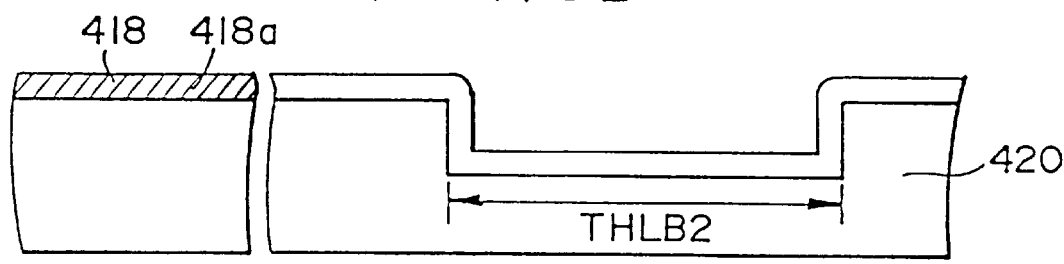
Figure 16C:
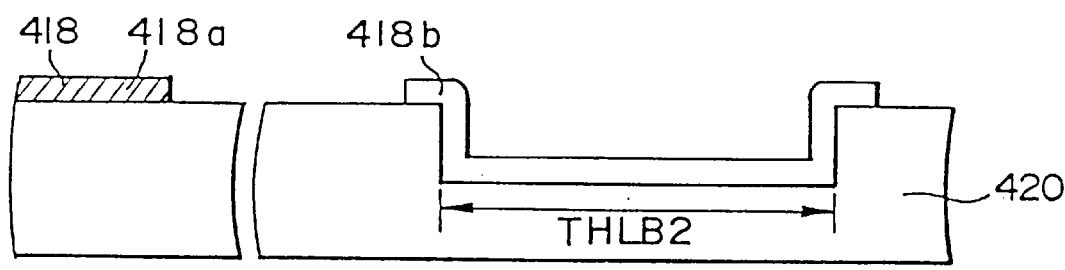
Figure 16D:
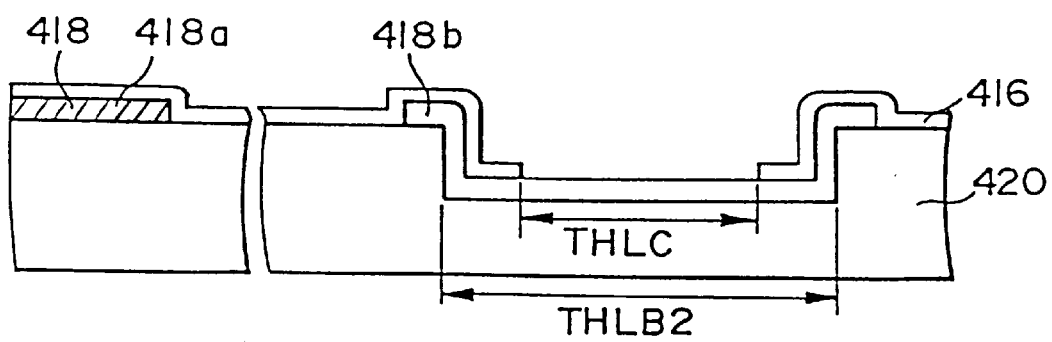

3) By applying the resist process in the lithographic technique and the RIE method in which the etching gas is $CCl_4+O_2$, a patterning of the PLYC (418) is effected to separate a region 418a and a region 418b in terms of layout (see FIG. 16C).

4) By applying the CVD method, an insulating layer 416 comprised of $SiO_2$ having a thickness of, for example, 300 angstroms is formed. Then, by applying the resist process in the lithographic technique and the RIE method in which the etching gas is $CHF_3$, a selective etching of the insulating layer 416 is effected to form the THLC (see FIG. 16D).

5) By applying the LPCVD method, a PLYD (414) having a thickness of, for example, 300 angstroms is formed. At this time, the PLYD (414) is a non-doped polycrystalline silicon layer or an amorphous silicon layer (see FIG. 17A).

6) By applying the resist process in the lithographic technique and the ion implantation method, the P-type impurity ions are implanted to the source region and drain region of the TFT, and into the region which is to be the power supplying line.

Figure 17A:
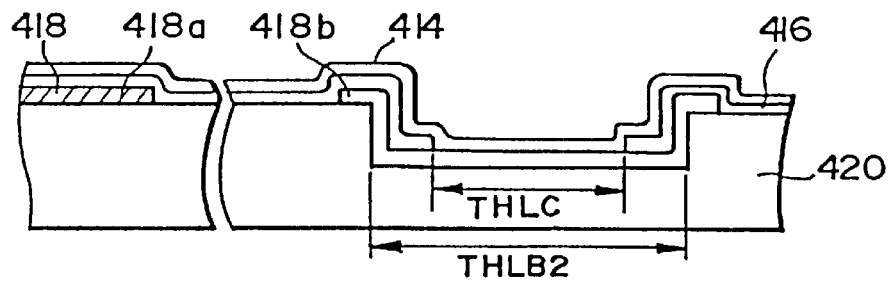
FIGS. 17A to 17D are also flow sectional views for explaining a manufacturing method of the third embodiment.
Figure 17B:
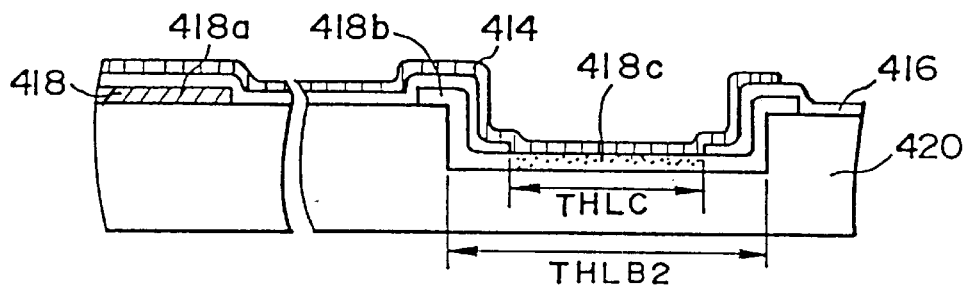
Figure 17C:
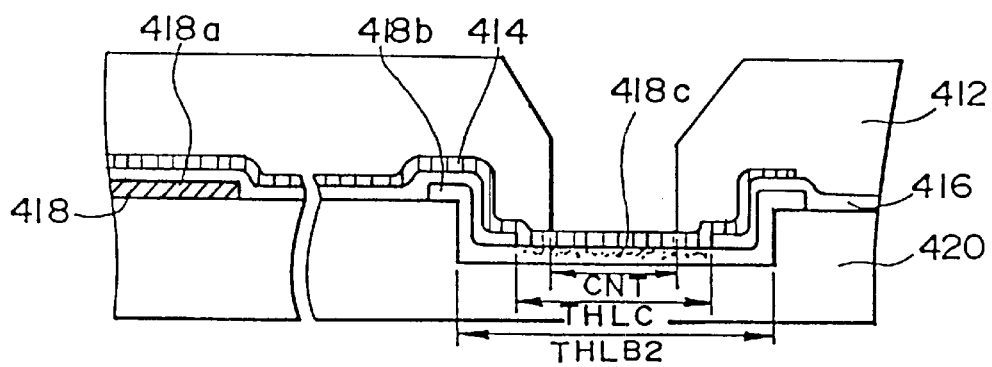
Figure 17D:
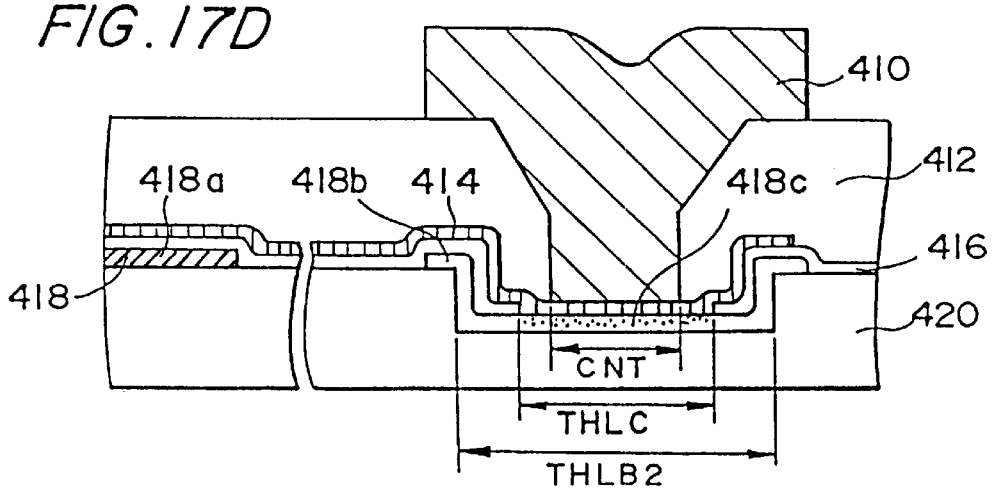
Figure 18:
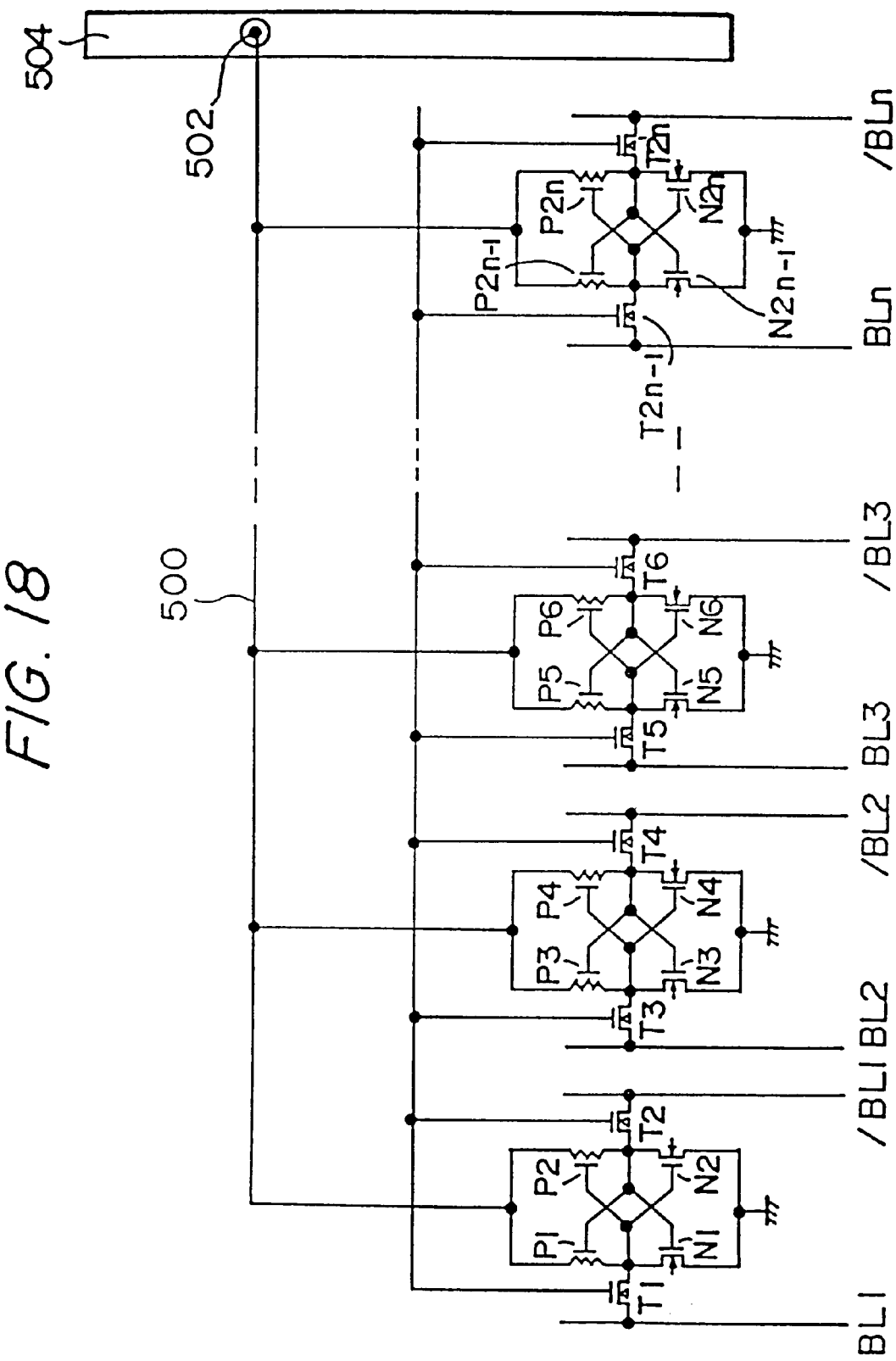
FIG. 18 is a view showing an example of circuit configuration of a semiconductor memory including a plurality of memory cells.

The P-type impurities implanted to the PLYD (414) is diffused in the PLYC (418) through a THLC portion by a heat treatment in subsequent processes, whereby a region 418c becomes the region in which the P-type impurities are diffused (see FIG. 17B).

7) By applying the LPCVD method, an insulating layer 412 comprised of $SiO_2$ of 500 angstroms and a BPSG of 3000 angstroms is formed. Next, heat treatment for flattening a BPSG film of the insulating layer 412 by reflowing is effected in $N_2$ atmosphere for about 20 minutes at 800° C. to 900° C. Then, the etching of the insulating layer 412 is effected by the resist process in the lithographic technique and wet etching method for making tapers, and further the RIE method in which etching gas is $CHF_3$ to form the CNT (see FIG. 17C).

8) By applying the sputtering method, an AL (410) having a thickness of, for example, 1 μm is formed, and this is subjected to the patterning by applying a normal photolithographic technique and etching to form signal wiring and power lines.

According to this embodiment, the height of the PLYD (414) viewed from the semiconductor substrate surface becomes low in the CNT forming area, so that penetration of the PLYD becomes difficult. Even if the penetration of the PLYD (414) occurs, since an etching stopper layer comprised of the PLYC (418) is provided below the PLYD, the AL (410) can be effectively prevented from penetrating to the lower layer of the PLYC. Moreover, the region 418c of the PLYC (418) is a layer in which the P-type impurities are diffused. Therefore, power can be supplied from the AL (410) to the PLYD (414) through the region 418c, and the generation of the reverse-direction parasitic diode can also be prevented. This can reduce impedance of power supplying paths and improve properties of memory cell data retention, and so on.

Incidentally, the present invention is not restricted to the above-described first to third embodiments, and various modifications can be made within the scope of the present invention.

For example, the structure and the manufacturing method of the memory cell explained in the above embodiments show examples thereof, and the present invention is not restricted to these structure and manufacturing method of the memory cell. In addition, materials of the first to third wiring layers (AL, PLYD, PLYC) are not restricted to those described in the above embodiments. Further, polarity of the impurities introduced into the second and third wiring layers is not restricted by the above embodiments.

What is claimed is:

1. A semiconductor memory including a plurality of memory cells of a static type including a pair of thin film transistors which become load elements, and a pair of drive transistors, comprising:

a first wiring layer formed of metal and becoming a power line;

a thin-film second wiring layer provided below said first wiring layer, said second wiring layer being formed of a first polycrystalline silicon and becoming source, drain and channel regions of said thin film transistors, and a power supplying line to said memory cells;

a first insulating layer between said first and second wiring layers and having a first contact hole for connecting said first and second wiring layers;

a third wiring layer which is provided below said second wiring layer and which becomes an etching stopper layer for the prevention of penetration in said first contact hole forming area, said third wiring layer being formed of a second polycrystalline silicon; and a second insulating layer between said second and third wiring layers and having a second contact hole which is provided below said first contact hole, and which directly connects said second wiring layer and said third wiring layer;

wherein first conductivity-type impurities are introduced into said second wiring layer, and wherein said etching stopper layer formed by said third wiring layer is non-doped at least in said first contact hole forming area and wherein second conductivity-type impurities which differ from said first conductivity-type impurities in polarity are introduced into said third wiring layer in an area of said memory cells and said first conductivity-type impurities are diffused from said second wiring layer to said non-doped area of said etching stopper layer.

2. A semiconductor memory according to claim 1, wherein a heating step for diffusing said first conductivity-type impurities from said second wiring layer to said etching stopper layer doubles as a heating step for activating said first conductivity-type impurities.

3. A semiconductor memory according to claim 1, wherein L3 is 1.5 µm or more where the distance between a boundary of an area of said third wiring layer into which said second conductivity-type impurities are introduced and an area into which said second conductivity-type impurities are not introduced so as to be non-doped, and an end of the boundary side of said second contact hole is L3.

4. A semiconductor memory according to claim 1, wherein L2 is larger than (L1+2×L4) where diameters of said first and second contact holes are L1, L2, and an alignment allowance of said first contact hole and said second contact hole is L4.

5. A semiconductor memory according to claim 1, wherein an insulating layer below said second wiring layer is formed into a concave shape at least in said first contact hole forming area, and wherein the height of said second wiring layer from a semiconductor substrate surface in the first contact hole forming area of said second wiring layer is lower than the height in the area other than said first contact hole forming area.

6. A semiconductor memory including a plurality of memory cells of a static type including a pair of thin film transistors which become load elements, and a pair of drive transistors, comprising:

a first wiring layer formed of metal and becoming a power line;

a thin-film second wiring layer formed of a first polycrystalline silicon provided below said first wiring layer, said second wiring layer becoming source, drain and channel regions of said thin film transistors, and a power supplying line to said memory cells; and a first contact hole for connecting said first and second wiring layers, wherein an insulating layer below said second wiring layer is formed into a concave shape at least in said first contact hole forming area, and wherein the height of said second wiring layer from a semiconductor substrate surface in the first contact hole forming area is lower than the height in the area other than said first contact hole forming area;

wherein L2 is 2×γ1 or less where a diameter of said concave shape is L2 and a thickness of an insulating layer between said first wiring layer and said second wiring layer in an area other than said first contact hole forming area is γ1.

7. A semiconductor memory according to claim 6, wherein said concave shape is formed using a forming step of said another contact hole for connecting said second wiring layer and the other layer below said second wiring layer.

8. A semiconductor memory according to claim 7, wherein D1 is smaller than D2×K where the etching depth of said concave shape is D1, an etching selection ratio of the other layer below said second wiring layer to said insulating layer below said second wiring layer is 1:K, and the thickness of the other layer is D2.

9. A semiconductor memory according to claim 7, wherein L1 is about (L2−2×L4) where the diameters of said first contact hole and said concave shape are L1, L2, and alignment allowance of said first contact hole and said concave shape is L4.

10. A method of manufacturing a semiconductor memory including a plurality of memory cells of a static type including a pair of thin film transistors which become load elements, and a pair of drive transistors, said method comprising the steps of:

forming a third wiring layer of a second polycrystalline silicon;

selectively introducing second conductivity-type impurities into said third wiring layer so as to form a non-doped contact area;

forming a second insulating layer above said third wiring layer;

forming a second contact hole in said second insulating layer over said contact area of said third wiring layer;

forming a thin-film second wiring layer of a first polycrystalline silicon which directly contacts said contact area of said third wiring layer through said second contact hole, said second wiring layer becoming source, drain and channel regions of said thin film transistors, and a power supplying line to said memory cells;

introducing first conductivity-type impurities which differ from said second conductivity-type impurities in polarity into said second wiring layer;

forming a first insulating layer above said second wiring layer;

heating said third wiring layer, second insulating layer, and second wiring layer so as to flatten said first insulating layer and diffuse said first conductivity-type impurities introduced into said second wiring layer to said non-doped etching stopper layer;

forming a first contact hole in said first insulating layer which is provided above said second contact hole; and forming a first wiring layer of metal which connects to said second wiring layer through said first contact hole, said first wiring layer becoming a power line;

wherein, in said step for introducing second conductivity-type impurities, an etching stopper layer formed by said third wiring layer for preventing penetration is selectively non-doped at least in said first contact hole forming area.

11. A method of manufacturing a semiconductor memory, according to claim 10, wherein said heating step doubles as a heating step for activating said first conductivity-type impurities.

12. A method of manufacturing a semiconductor memory, according to claim 10, wherein an insulating layer below said second wiring layer is formed into a concave shape at least in said first contact hole forming area, and the height of said second wiring layer from a semiconductor substrate surface in said first contact hole forming area is lowered than the height in the area other than said first contact hole forming area.

13. A method of manufacturing a semiconductor memory including a plurality of memory cells, said method comprising the steps of:

forming a third wiring layer;

forming a second insulating layer above said third wiring layer;

forming a second contact hole in said second insulating layer;

forming a thin-film second wiring layer which connects the other layer below said second wiring layer through said second contact hole;

forming a first insulating layer above said second wiring layer;

forming a first contact hole in said first insulating layer; and forming a first wiring layer which connects said second wiring layer through said first contact hole;

wherein an insulating layer below said second wiring layer is formed into a concave shape using said second contact hole forming step at least in said first contact hole forming area, and the height of said second wiring layer from a semiconductor substrate surface in said first contact hole forming area is lower than the height in the area other than said first contact hole forming area;

wherein D1 is smaller than D2×K where an etching depth of said concave shape is D1, an etching selection ratio of the other layer below said second wiring layer to said insulating layer below said second wiring layer is 1:K, and the thickness of the other layer is D2.

14. A method of manufacturing a semiconductor memory according to claim 13, wherein said memory cells are memory cells of a static type including a pair of thin film transistors which become load elements, and a pair of drive transistors, wherein said first wiring layer is formed of metal and becomes a power line, wherein said second wiring layer is formed of a first polycrystalline silicon and becomes source, drain and channel regions of said thin film transistors, and a power supplying line to said memory cells, and wherein said third wiring layer is formed of a second polycrystalline silicon.

* * * * *